United States Patent
Kubo et al.

(10) Patent No.: US 8,269,205 B2
(45) Date of Patent: Sep. 18, 2012

(54) INFORMATION RECORDING AND REPRODUCING DEVICE

(75) Inventors: Kohichi Kubo, Kanagawa-ken (JP); Chikayoshi Kamata, Kanagawa-ken (JP); Takayuki Tsukamoto, Kanagawa-ken (JP); Shinya Aoki, Kanagawa-ken (JP); Takahiro Hirai, Kanagawa-ken (JP); Tsukasa Nakai, Tokyo (JP); Toshiro Hiraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 12/886,254

(22) Filed: Sep. 20, 2010

(65) Prior Publication Data

US 2011/0031459 A1 Feb. 10, 2011

Related U.S. Application Data

(63) Continuation of application No. PCT/JP2008/056493, filed on Apr. 1, 2008.

(51) Int. Cl.
*H01L 29/02* (2006.01)
(52) U.S. Cl. . 257/2; 257/4; 257/E45.003; 257/E31.029; 365/148
(58) Field of Classification Search .................. 257/2, 4, 257/E31.029, E27.004, E45.002, E45.003; 365/148, 189, 218; 438/95
See application file for complete search history.

(56) References Cited

U.S. PATENT DOCUMENTS

| 2007/0285966 A1* | 12/2007 | Toda et al. ............ 365/148 |
| 2007/0285967 A1* | 12/2007 | Toda et al. ............ 365/148 |
| 2010/0127235 A1 | 5/2010 | Tsukamoto et al. |

FOREIGN PATENT DOCUMENTS

| JP | 2002-526362 | 8/2002 |
| JP | 2002-362923 | 12/2002 |
| JP | 2006-080259 | 3/2006 |
| JP | 2007-080311 | 3/2007 |
| JP | 2007-243183 | 9/2007 |
| JP | 2007-299436 | 11/2007 |
| WO | WO 00/17106 | 3/2000 |

OTHER PUBLICATIONS

Toshitsugu Sakamoto et al., "Kotai Denkaishitsu Memory," Oyo Butsuri, 2006, vol. 75, No. 9, pp. 1126-1130.
U.S. Appl. No. 13/182,095, filed Jul. 13, 2011, Yamaguchi.

* cited by examiner

*Primary Examiner* — Brook Kebede
(74) *Attorney, Agent, or Firm* — Oblon, Spivak, McClelland, Maier & Neustadt, L.L.P.

(57) ABSTRACT

According to one embodiment, an information recording and reproducing device includes a first layer, a second layer and a recording layer. The recording layer is provided between the first layer and the second layer and being capable of reversibly changing between a first state having a first resistance and a second state having a second resistance higher than the first resistance. The recording layer includes a first compound layer and a second compound layer. The first compound layer contains a first compound. The first compound includes a first cation element and a second cation element of a type different from the first cation element. The second compound layer contains a second compound. The second compound includes a transition element having a d-orbital partially filled with electron, and the second compound includes a void site capable of storing at least one of the first cation element and the second cation element.

19 Claims, 20 Drawing Sheets

RECORDING (SET) OPERATION

○ A ION
● M ION
◯ X ION
○ A (metal)

| | Material of first compound layer | Crystal structure of first compound layer | Material of second compound layer | Crystal structure of second compound layer | Forward set voltage(V) | Backward set voltage(V) |
|---|---|---|---|---|---|---|
| 1st experimental example | $Zn_{1.1}Mn_{1.9}O_4$ | Spinel structure | $Ti_{0.9}Nb_{0.1}O_2$ | Ramsdellite structure | 1.5 | 2.5 |
| 2nd experimental example | $ZnCo_2O_4$ | Spinel structure | $Ti_{0.9}Nb_{0.1}O_2$ | Ramsdellite structure | 1.5 | 2.5 |
| 3rd experimental example | $ZnMn_2O_4$ | Spinel structure | $Ti_{0.9}Nb_{0.1}O_2$ | Ramsdellite structure | 1.5 | 2.5 |
| 4th experimental example | $ZnCo_2O_4$ | Spinel structure | $Zr_{0.9}Nb_{0.1}NF$ | Fluorite structure | 1.5 | 2.5 |
| 5th experimental example | $ZnMnO_3$ | Ilmenite structure | $Hf_{0.98}Mo_{0.02}NF$ | Rutile structure | 1.5 | 2.5 |
| 6th experimental example | $ZnMoO_3$ | Ilmenite structure | $Zr_{0.98}Mo_{0.02}O_2$ | Fluorite structure | 1.5 | 2.5 |
| 7th experimental example | $ZnNbN_2$ | $LiMoN_2$ structure | $Nb_{0.98}Mo_{0.02}ON$ | TaON structure | 1.5 | 2.5 |
| 8th experimental example | $ZnTaN_2$ | $LiMoN_2$ structure | $TaON_{1.18}$ | TaON structure | 1.5 | 2.5 |
| 9th experimental example | $ZnMn_2O_4$ | Spinel structure | $Nb_{1.98}Mo_{0.02}O_5$ | $Nb_2O_5$ structure | 1.5 | 2.5 |
| 10th experimental example | $ZnCo_2O_4$ | Spinel structure | $Ta_{1.98}W_{0.02}O_5$ | $Nb_2O_5$ structure | 1.5 | 2.5 |
| 11th experimental example | $ZnFe_2O_4$ | Spinel structure | $Ta_{1.98}W_{0.02}O_5$ | $Nb_2O_5$ structure | 1.5 | 2.5 |
| 12th experimental example | $ZnFe_2O_4$ | Spinel structure | $Ga_{1.98}Ti_{0.02}O_3$ | Corundum structure | 1.5 | 2.5 |
| 13th experimental example | $MgMn_2O_4$ | Spinel structure | $In_{1.98}Hf_{0.02}O_3$ | Corundum structure | 1.5 | 2.5 |
| 14th experimental example | $MgMn_2O_4$ | Spinel structure | $Ga_{1.98}Ti_{0.02}ON$ | Corundum structure | 1.5 | 2.5 |
| 15th experimental example | $MgMoO_3$ | Ilmenite structure | $Nb_{1.98}Mo_{0.02}OF$ | $Nb_2O_5$ structure | 1.5 | 2.5 |
| Comparative example | $Zn_{1.1}Mn_{1.9}O_4$ | Spinel structure | $TiO_2$ | Ramsdellite structure | 1.5 | 1 |

FIG. 26

INFORMATION RECORDING AND REPRODUCING DEVICE

CROSS-REFERENCE TO RELATED APPLICATIONS

This is a continuous application of International Application PCT/JP2008/056493, filed on Apr. 1, 2008; the entire contents of which are incorporated herein by reference.

FIELD

Embodiments described herein relate generally to an information recording and reproducing device.

BACKGROUND OF THE INVENTION

Small-sized portable devices are widespread worldwide these days, and at the same time demand for small-sized and large-capacity nonvolatile memory is rapidly expanding with significant progress in high-speed information transmission network. Among such memories, NAND flash memory and small-sized HDD (hard disk drive) have made rapid progress in recording density and form a big market.

Under such a situation, some ideas of new memory that aim to greatly exceed the limit of recording density are proposed. For example, PRAM (phase-change memory) uses a material capable of having two states, an amorphous state (OFF) and a crystal state (ON), as a recording material, and uses a method that relates the two states to two-value data "0" and "1" to record data.

In regard to writing/erasing, for example, a high-power pulse is applied to the recording material to produce the amorphous state, and a low-power pulse is applied to the recording material to produce the crystal state.

The readout is performed by passing a readout current small enough not to cause writing/erasing through the recording material and measuring the electric resistance of the recording material. The resistance value of the recording material in the amorphous state is larger than the resistance value of the recording material in the crystal state, and the ratio thereof is about $10^3$, for example.

Furthermore, also a memory is reported that uses changing the resistance by a method different from that of the PRAM. For example, there are: a memory layer including a high resistance film and an ion source layer (JP-A 2007-80311 (Kokai)); and a variable resistance device including a conductor film and an insulator film (JP-A 2007-299436 (Kokai)). In these memories, an ion is used, and a metal element is ionized or an ionized metal element moves; thereby, the resistance value of the memory device changes. In the former, the ion source layer contains: one or more elements (metal element) selected from Ag, Cu, and Zn; and one or more elements (chalcogenide element) selected from S, Se, and Te. In the latter, as the material of the conductor film, for example, a metal film, alloy film (e.g. CuTe alloy film), metal compound film, and the like containing one or more metal elements selected from Cu, Ag, and Zn are given.

BRIEF DESCRIPTION OF THE DRAWINGS

FIG. 26 is a table illustrating examination results of the first to fifteenth experimental examples and the comparative example.

DETAILED DESCRIPTION OF THE INVENTION

Figure 1:
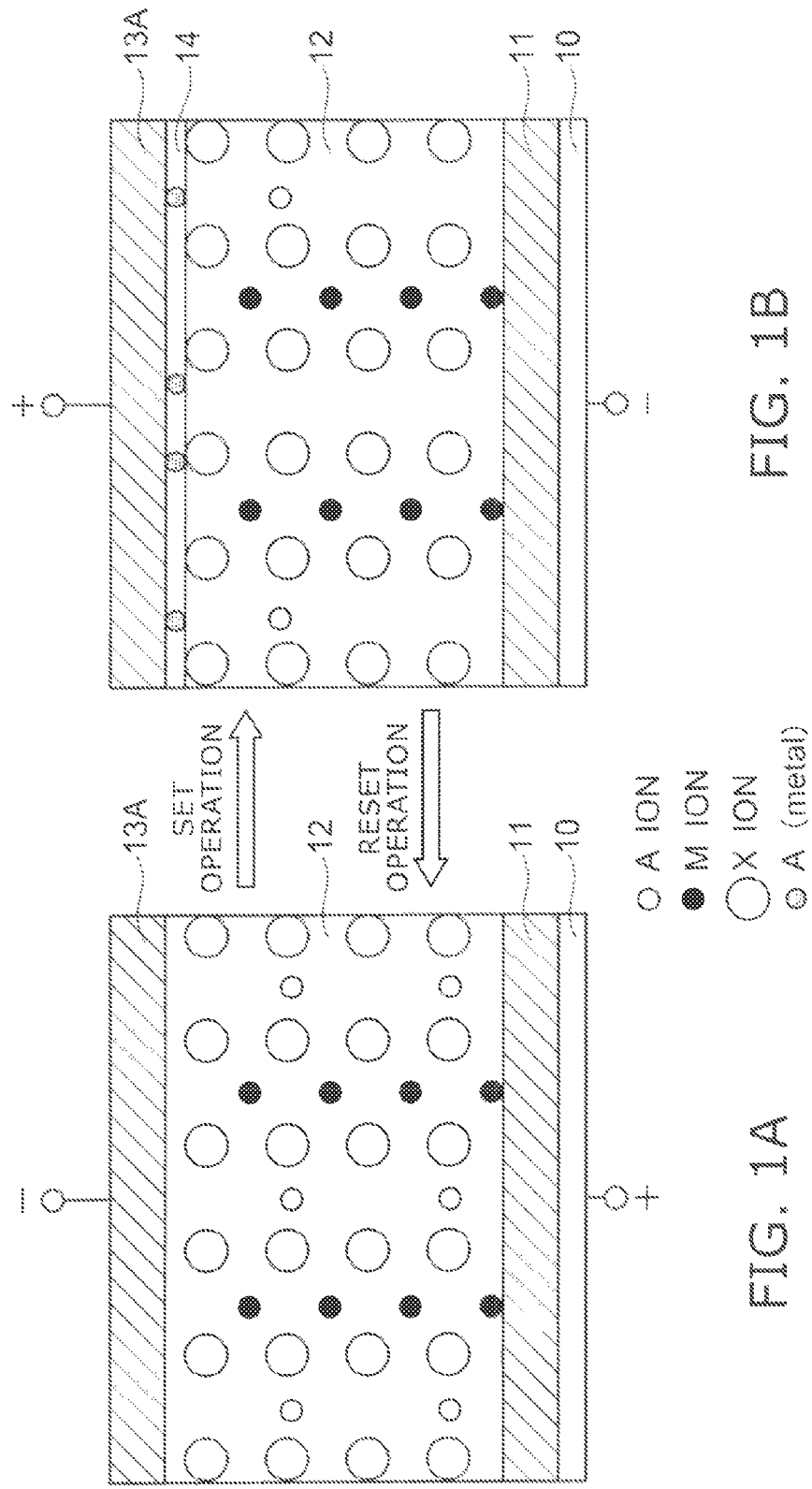
FIGS. 1A and 1B are conceptual views for describing an example of the operation of the recording/reproducing of information in an information recording and reproducing device according to an embodiment.
Figure 2:
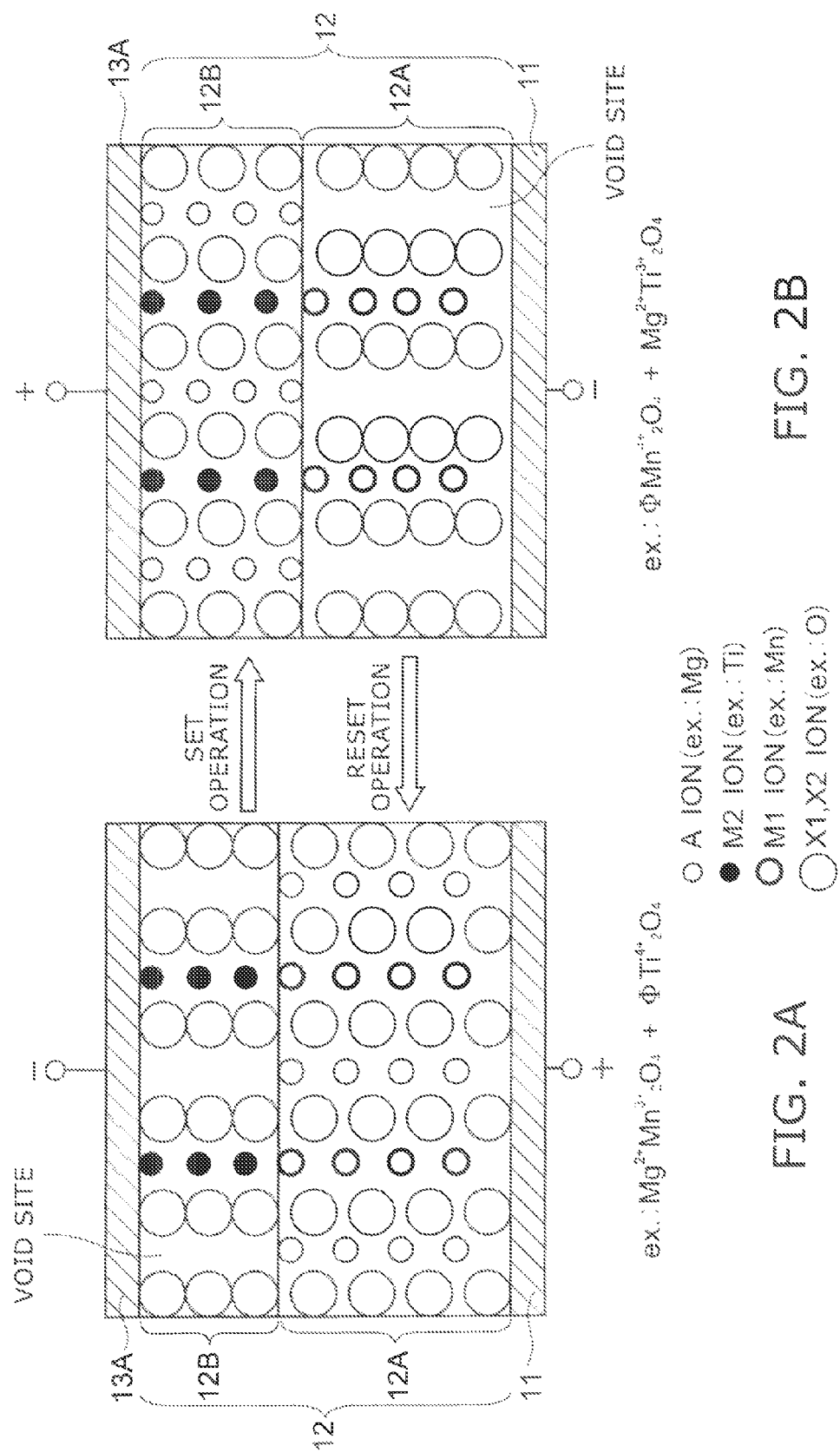
FIGS. 2A and 2B are schematic views illustrating the structure of a recording unit of the information recording and reproducing device of the embodiment.
Figure 3:
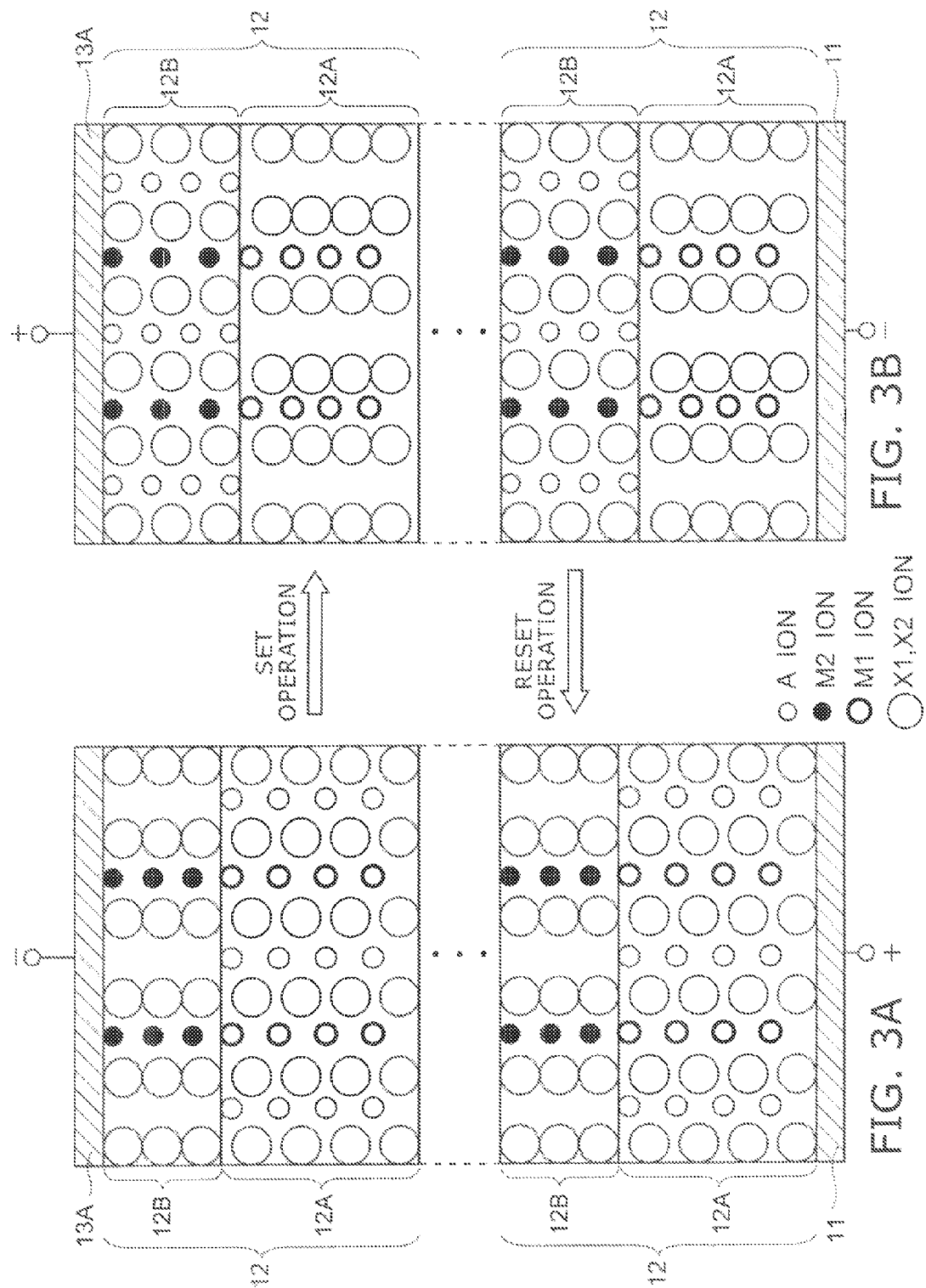
FIGS. 3A and 3B are schematic views illustrating the specific example of a recording layer having a first compound layer and a second compound layer alternately stacked.

In general, according to one embodiment, an information recording and reproducing device includes a first layer, a second layer and a recording layer.

The recording layer is provided between the first layer and the second layer and being capable of reversibly changing between a first state having a first resistance and a second state having a second resistance higher than the first resistance by a current supplied via the first layer and the second layer.

The recording layer includes a first compound layer and a second compound layer.

The first compound layer contains a first compound.

The first compound includes a first cation element and a second cation element of a type different from the first cation element, at least one of the first cation element and the second cation element being a transition element having a d-orbital partially filled with electron.

The second compound layer contains a second compound. The second compound includes a transition element having a d-orbital partially filled with electron, and the second compound includes a void site capable of storing at least one of the first cation element and the second cation element.

Embodiments of the invention will now be described with reference to the drawings. In the drawings, like components are marked with the same reference numerals and a detailed description is omitted as appropriate.

FIGS. 1A and 1B are conceptual views for describing an example of the operation of the recording/reproducing of information in an information recording and reproducing device according to an embodiment of the invention.

FIG. 1A is a cross-sectional view of a recording unit. The recording unit has a structure in which a recording layer 12 is provided between an electrode layer 11 (e.g. first layer) and an electrode layer 13A (e.g. second layer). The electrode layers 11 and 13A are provided in order to obtain an electrical connection to the recording layer 12. The electrode layers 11 and 13A may function also as a barrier layer that suppresses, for example, the diffusion of elements between the recording layer 12 and the components thereabove and therebelow, and the like. A buffer layer 10 is attached to the recording unit.

In the recording layer 12 in the recording unit illustrated in FIGS. 1A and 1B, the small open circle represents an A ion (for example, a diffusible ion), the small filled circle represents an M ion (for example, a matrix ion), the large open circle represents an X ion (for example, an anion), and the small shaded circle represents the A in a metal state.

The recording layer 12 contains oxide of a transition metal, a polymer, or a solid electrolyte that can change its resistance by voltage application. The recording layer 12 may be specifically formed of, for example, a compound containing at least two types of cation elements. In this case, the recording layer 12 contains a first compound in which at least one of the cation elements is a transition element having a d-orbital partially filled with electron, and the shortest distance between adjacent cation elements is not more than 0.32 nm. Using the recording layer 12 containing this compound enables to produce the resistance change with relatively low power consumption. The following, for example, is given as the material of the recording layer 12 like this.

For example, the spinel structure expressed by $A_xM_yX_4$ ($0.1 \leq x \leq 2.2$, $1.5 \leq y \leq 2$) is given. A and M are elements different from each other, and at least one of them is a transition element having a d-orbital partially filled with electron. X is an element including at least one selected from the group consisting of O (oxygen) and N (nitrogen).

A is at lease one element selected from the group consisting of Na, K, Rb, Be, Mg, Ca, Sr, Ba, Al, Ga, Mn, Fe, Co, Ni, Cu, Zn, S, P, Se, Ge, Ag, Au, Cd, Sn, Sb, Pt, Pd, Hg, Tl, Pb, and Bi.

Furthermore, A is preferably at least one element selected from the group consisting of Mg, Mn, Fe, Co, Ni, Zn, Cd, and Hg. This is because using these elements optimizes the ion radius for keeping the crystal structure, and also can ensure a sufficient ion mobility. Furthermore, it becomes easy to control the valence of ion to divalence.

Furthermore, A is more preferably at least one element selected from Zn, Cd, and Hg. This is because using these elements facilitates causing the movement of cation.

M is at least one element selected from the group consisting of Al, Ga, Ti, Ge, Sn, V, Cr, Mn, Fe, Co, Ni, Nb, Ta, Mo, W, Re, Ru, and Rh.

Furthermore, M is preferably at least one element selected from the group consisting of Ti, Zr, Hf, V, Nb, Ta, Cr, Mo, W, Mn, Re, Fe, Co, Ni, Al, and Ga. This is because using these elements facilitates the control of the electronic state in the crystal.

Furthermore, M is more preferably at least one transition element selected from the group (referred to as a "group 1" for convenience sake) consisting of Cr, Mo, W, Mn, and Re. This is because using these elements retains the matrix structure stably, and thereby enables to repeat switching stably.

Furthermore, M still more preferably includes at least one element selected from the group consisting of Fe, Co, Ni, Al, and Ga in addition to a transition element of the group 1 mentioned above. This is because using these elements in place of part of the elements of the group 1 retains the matrix structure more stably, and thereby enables to repeat switching more stably.

In addition to the above, for example, the delafossite structure expressed by $A_xM_yX_2$ ($0.1 \leq x \leq 1.1$, $0.9 \leq y \leq 1.1$) is given. A and M are elements different from each other, and at least one of them is a transition element having a d-orbital partially filled with electron. X is an element including at least one selected from the group consisting of O (oxygen) and N (nitrogen).

A is at least one element selected from the group consisting of Li, Na, Be, Mg, Ca, Cu, Ag, Au, Pt, Pd, Rh, Hg, and Tl.

Furthermore, A is preferably at least one element selected from the group consisting of Mg, Mn, Fe, Co, Ni, Cu, Ag, and Zn. This is because using these elements optimizes the ion radius for keeping the crystal structure, and can ensure a sufficient ion mobility. Furthermore, it becomes easy to control the coordination number to two.

Furthermore, A is preferably at least one element selected from the group consisting of Cu and Ag. This is because using these elements can provide the delefossite structure easily.

M is at least one element selected from the group consisting of Al, Ga, Sc, In, Y, La, Pr, Nd, Sm, Eu, Gd, Tb, Dy, Ho, Er, Tm, Tb, Lu, Ti, Ge, Sn, V, Cr, Mn, Fe, Co, Ni, Nb, Ta, Mo, W, Ru, Rh, and Pd.

Furthermore, M is preferably at least one element selected from the group consisting of Y, Sc, V, Cr, Mn, Fe, Co, Ni, Al, and Ga. This is because using these elements facilitates the control of the electronic state in the crystal.

Furthermore, M is still more preferably at least one element selected from the group consisting of Fe, Co, and Al. This is because using these elements can provide the delafossite structure easily.

In addition to the above, for example, the wolframite structure expressed by $A_xM_yX_4$ ($0.5 \leq x \leq 1.1$, $0.7 \leq y \leq 1.1$) is given. A and M are elements different from each other, and at least one of them is a transition element having a d-orbital partially filled with electron. X is an element including at least one selected from the group consisting of O (oxygen) and N (nitrogen).

A is at least one element selected from the group consisting of Na, K, Rb, Be, Mg, Ca, Sr, Ba, Al, Ga, Ti, V, Cr, Mn, Fe, Co, Ni, Cu, Zn, Si, P, S, Se, Ge, Ag, Au, Cd, Sn, Sb, Pt, Pd, Hg, Tl, Pb, and Bi.

Furthermore, A is preferably at least one element selected from the group consisting of Ti, V, Mn, Fe, Co, and Ni. This is because using these elements optimizes the ion radius for keeping the crystal structure, and also can ensure a sufficient ion mobility. Furthermore, it becomes easy to control the valence of ion to divalence.

Furthermore, A is more preferably at least one element selected from the group consisting of Mn, Fe, Co, and Ni. This is because using these elements can produce the resistance change easily.

M is at least one element selected from the group consisting of V, Nb, Ta, Cr, Mn, Mo, and W.

Furthermore, M is preferably at least one element selected from the group consisting of Cr, Mo, and W. This is because using these elements can provide the wolframite structure easily.

In addition to the above, for example, the ilmenite structure expressed by $A_xM_yX_3$ ($0.5 \leq x \leq 1.1$, $0.9 \leq y \leq 1$) is given. A and M are elements different from each other, and at least one of them is a transition element having a d-orbital partially filled with electron. X is an element including at least one selected from the group consisting of O (oxygen) and N (nitrogen).

A is at least one element selected from the group consisting of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi.

Furthermore, A is preferably at least one element selected from the group consisting of Mg, Mn, Fe, Co, Ni, and Zn. This is because using these elements optimizes the ion radius for keeping the crystal structure, and also can ensure a sufficient ion mobility. Furthermore, it becomes easy to control the valence of ion to divalence.

Furthermore, A is more preferably at least one element selected from the group consisting of Fe and Ni. This is because using these elements can provide the ilmenite structure easily.

M is at least one element selected from the group consisting of Al, Ga, Ti, Ge, Sn, V, Cr, Mn, Fe, Co, Ni, Nb, Ta, Mo, W, Re, Ru, and Rh.

Furthermore, M is preferably at least one element selected from the group consisting of Ti, Zr, Hf, V, Nb, Ta, Cr, Mn, Fe, Co, and Ni. This is because using these elements facilitates the control of the electronic state in the crystal.

Furthermore, M is preferably at least one element selected from the group consisting of Ti, Zr, Hf, and V. This is because using these elements can provide the ilmenite structure easily.

In regard to the molar ratios x and y of the spinel structure expressed by $A_xM_yX_4$ ($0.1 \leq x \leq 2.2$, $1.5 \leq y \leq 2$), the delafossite structure expressed by $A_xM_yX_2$ ($0.1 \leq x \leq 1.1$, $0.9 \leq y \leq 1.1$), the wolframite structure expressed by $A_xM_yX_4$ ($0.5 \leq x \leq 1.1$, $0.7 \leq y \leq 1.1$), and the ilmenite structure expressed by $A_xM_yX_3$ ($0.5 \leq x \leq 1.1$, $0.9 \leq y \leq 1$), the lower limit of the numerical range is set in order to keep the crystal structure, and the upper limit thereof is set in order to control the electronic state in the crystal.

Furthermore, as described above, to cause easily the diffusion of the A ion by voltage application, a layer of the A ion element may be disposed in the direction connecting the electrodes. To this end, the c-axis of crystal is preferably disposed parallel to the film surface in the spinel structure, ilmenite structure, and delefossite structure, and the a-axis of crystal is preferably disposed parallel to the film surface in the wolframite structure.

Using a recording layer like the above as a means for a desired orientation can achieve a recording density of the Pbpsi (peta bit per square inch) class, and also can reduce power consumption.

In regard to a material having the structure described above, in FIGS. 1A and 1B, two types of cation elements are selected so that the A ion may diffuse easily in the first compound and the M ion may not diffuse in the first compound. In this case, since the M ion which does not diffuse retains the crystal structure of the first compound, the movement of the A ion can be controlled easily. Therefore, by using the first compound having such a structure, the resistance value of the recording layer 12 of the information recording and reproducing device can be changed easily.

Here, in this specification, the high resistance state is taken as a reset (initial) state, and the low resistance state is taken as a set state. However, this is for the sake of convenience, and there may be the opposite case, that is, the case where the low resistance state is the reset (initial) state and the high resistance state is the set state, depending on the selection of materials, the manufacturing method, and the like. Also such a case is included in the scope of this embodiment.

When a voltage is applied to the recording layer 12 to generate an electric potential gradient in the recording layer 12, some of the A ions move in the crystal. Accordingly, in this embodiment, the initial state of the recording layer 12 is set to an insulator (high resistance state phase), and the electric potential gradient phase-changes the recording layer 12 to provide the recording layer 12 with electrical conductivity (low resistance state phase). Thereby, the recording of information is performed.

First, for example, a state is created in which the electric potential of the electrode layer 13A is lower than the electric potential of the electrode layer 11. Assuming that the electrode layer 11 is set at a fixed potential (e.g. the ground potential), a negative potential may be applied to the electrode layer 13A.

At this time, some of the A ions in the recording layer 12 move to the electrode layer 13A (cathode) side, and the number of A ions in the recording layer (crystal) 12 decreases relative to the number of X ions. The A ion having moved to the electrode layer 13A side receives an electron(s) from the electrode layer 13A to deposit as an A atom, which is a metal, to form a metal layer 14. Therefore, in a region near the electrode layer 13A, since the A ion is reduced to act like a metal, the electric resistance thereof decreases significantly.

Alternatively, in the case where the crystal structure of the recording layer 12 includes a void site that the A ion may occupy as in the case of, for example, the spinel structure, the A ion having moved to the electrode layer 13A side may occupy the void site on the electrode layer 13A side. Also in this case, to satisfy the condition of local charge neutrality, the A ion receives an electron(s) from the electrode layer 13A to act like a metal.

In the recording layer 12, the X ion becomes surplus, and this results in increasing the valence of the A ion or the M ion left in the recording layer 12. At this time, if the A ion or the M ion is selected so that the electric resistance may decrease with the increase of the valence, the electric resistances of both the metal layer 14 and the recording layer 12 decrease due to the movement of the A ion. Therefore, the entire recording layer phase-changes into the low resistance state phase. In other words, the information recording (set operation) is completed.

The information reproducing can be performed easily by, for example, applying a voltage pulse to the recording layer 12 and detecting the resistance value of the recording layer 12. The amplitude of the voltage pulse may be set to a value minute enough not to cause the movement of the A ion.

The process described above is a kind of electrolysis, and can be seen as a process in which an oxidizing agent is generated on the electrode layer (anode) 11 side by electrochemical oxidation, and a reducing agent is generated on the electrode layer (cathode) 13A side by electrochemical reduction.

Therefore, to turn the low resistance state phase back to the high resistance state phase, for example, the recording layer 12 may be Joule-heated by a large current pulse to accelerate the oxidation reduction reaction in the recording layer 12. That is, due to the Joule heat by the large current pulse, the A ion turns back into the crystal structure (recording layer 12) which is more stable thermally, and the initial high resistance state phase appears (reset operation).

Alternatively, the reset operation can be performed by applying a voltage pulse in the direction opposite to that during the set operation. In other words, assuming that the electrode layer 11 is set at a fixed potential (e.g. the ground potential) as at the time of the set, a positive potential may be applied to the electrode layer 13A. Then, the A atom near the electrode layer 13A gives an electron(s) to the electrode layer 13A to become the A ion, and then goes back into the crystal structure (recording layer 12) due to the electric potential gradient in the recording layer 12. Thereby, the valence of some of the A ions of which the valence has been increased decreases to the same value as in the initial state. Accordingly, a change is produced into the initial high resistance state phase.

However, in this operation, it is preferable that the reset operation does not occur at room temperature (a sufficiently long retention time is ensured) and further power consumption during the reset operation is sufficiently small.

The former matter can be handled by: setting the coordination number of the A ion small (ideally not more than two); setting the valence thereof not less than two; or increasing the valence of the X ion (ideally not less than three).

If the A ion is monovalent like an Li ion, a sufficient transfer resistance of ion cannot be obtained in the set state, and the A ion element immediately turns from the metal layer 14 back into the recording layer 12. In other words, a sufficiently long retention time cannot be obtained. Furthermore, if the A ion has a valence of three or more, since the voltage of the set operation is large, there is a possibility that crystal collapse is caused. Therefore, the valence of the A ion is preferably set to divalence for the information recording and reproducing device.

The latter matter can be handled by: setting the valence of the A ion not more than two in order not to cause crystal break; optimizing the ion radius of the A ion so that the A ion can move in the recording layer (crystal) 12; and using a structure in which a transfer path exists. Such elements and crystal structures as are described above may be used for the recording layer 12 of the sort.

In the case where a cation having a small coordination number is used as the A ion like the delafossite structure (in the case of the delafossite structure, the coordination number of the A ion is two), the valence of the A ion may be set to +1 to reduce the Coulomb repulsion force. This facilitates the diffusion of the A ion, and can reduce power consumption during the reset operation. Furthermore, since the coordination number is small, the state after the diffusion can be retained stably.

Next, the mixing ratio of the individual atoms will now be described.

In the case where there is a void site that the A ion may occupy, and in the case where the A ion can occupy a site that the M ion occupies originally, the mixing ratio of the A ion may be optional in some degree. Furthermore, also in the case where there is a surplus/loss of the X ion, the mixing ratio of the A ion or the M ion deviates from that of the stoichiometric composition. Therefore, the mixing ratio of the A ion or the M ion is provided with ranges. Actually, the mixing ratio of the A ion can be optimized so that the resistance of each state or the diffusion coefficient of the A ion may be an optimal value.

The lower limit of the mixing ratio of the A ion and the M ion is set so as to fabricate easily the first compound having a desired crystal structure. If the total amount of ions that occupy the sites of the M ion is too small, it is difficult to retain stably the structure at the time after the A ion is extracted.

As described above, this embodiment can facilitate the diffusion of cation by using the material described above for the recording layer 12, reduce power consumption necessary for the resistance change, and increase thermal stability. Furthermore, since the resistance change is produced by using the diffusion of a cation element in the crystal structure, an information recording and reproducing device can be provided that can control operating characteristics easily and has a small variation in operating characteristics between cells.

The ease of the movement of ion is different between in the crystal structure and in the peripheral portion of the crystal particles. Therefore, to make recording and erasing characteristics uniform in different positions while utilizing the movement of the diffusible ion in the crystal structure, the recording layer preferably includes a polycrystalline state or single crystal state. When the recording layer is in a polycrystalline state, in view of the ease of film-formation, the size of the crystal particle in the direction of the recording film cross section preferably follows a distribution having a single peak, and the average thereof is preferably not less than 3 nm. The average of the crystal particle size is more preferably not less than 5 nm because this facilitates film-formation more, and is still more preferably not less than 10 nm because recording and erasing characteristics can be made more uniform in different positions.

Since an oxidizing agent is generated on the electrode layer (anode) 11 side after the set operation, the electrode layer 11 is preferably formed of a material difficult to oxidize (for example, electrically conductive nitride, electrically conductive oxide, etc.).

Furthermore, the electrode layer 11 is preferably formed of a material having no ion conductivity.

The following is given as such a material. Among them, $LaNiO_3$ may be used in view of overall characteristics including a good electric conductivity and the like.

$MN$

M is at least one element selected from the group consisting of Ti, Zr, Hf, V, Nb, and Ta. N is nitrogen.

$MO_x$

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. The molar ratio x satisfies $1 \leq x \leq 4$.

$AMO_3$

A is at least one element selected from the group consisting of La, K, Ca, Sr, Ba, and Ln (lanthanoids).

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

$A_2MO_4$

A is at least one element selected from the group consisting of K, Ca, Sr, Ba, and Ln (lanthanoids).

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

Since a reducing agent is generated on the protection layer (cathode) 13A side after the set operation, the protection layer (electrode layer) 13A preferably has the function of suppressing reaction of the recording layer 12 with the air.

As such a material, for example, amorphous carbon, diamond-like carbon, and semiconductors such as $SnO_2$ are given.

The electrode layer 13A may function as a protection layer that protects the recording layer 12. Alternatively, a protection layer may be provided in place of the electrode layer 13A. In this case, the protection layer may be either an insulator or a conductor.

Furthermore, a heater layer (a material with a resistivity of about $10^{-5}$ Ωcm or more) may be provided on the cathode side, here, on the electrode layer 13A side in order to efficiently perform the heating of the recording layer 12 during the reset operation.

Next, another example of the recording layer 12 will now be described with reference to FIGS. 2A and 2B and FIGS. 3A and 3B.

FIGS. 2A and 2B are schematic views illustrating the structure of a recording unit of the information recording and reproducing device of this embodiment.

Also this recording unit has a structure in which the recording layer 12 is provided between the electrode layers 11 and 13A.

In a first compound layer 12A in the recording unit illustrated in FIGS. 2A and 2B, the small open circle represents the A ion (for example, a diffusible ion), the small thick open circle represents an M1 ion (for example, a matrix ion), and the large open circle represents an X1 ion (for example, an anion). In a second compound layer 12B in the recording unit illustrated in FIGS. 2A and 2B, the filled circle represents an M2 ion (for example, a transition element ion), and the large open circle represents an X2 ion (for example, an anion).

Also in the information recording and reproducing device according to this specific example, as described below in detail, a voltage is applied between the electrode layers 11 and 13A and the recording layer 12 to cause the phase change in the recording layer 12, and thereby the resistance changes to record information.

The recording layer 12 includes: the first compound layer 12A disposed on the electrode layer 11 side; and the second compound layer 12B disposed on the electrode layer 13A side and in contact with the first compound layer 12A.

The first compound layer 12A is formed of a compound containing at least two types of cation elements. Specifically, it is expressed by $A_xM1_yX1_z$. At least one of the cation elements of the first compound is a transition element having a d-orbital partially filled with electron The movement of the A ion is easily caused in a compound of one of the spinel structure expressed by $A_xM_yX_4$ ($0.1 \leq x \leq 2.2$, $1.5 \leq y \leq 2$), the delafossite structure expressed by $A_xM_yX_2$ ($0.1 \leq x \leq 1.1$, $0.9 \leq y \leq 1.1$), the wolframite structure expressed by $A_xM_yX_4$ ($0.5 \leq x \leq 1.1$, $0.7 \leq y \leq 1.1$), and the ilmenite structure expressed by $A_xM_yX_3$ ($0.5 \leq x \leq 1.1$, $0.9 \leq y \leq 1$), which has a structure like the recording unit illustrated in FIGS. 1A and 1B. Therefore, the compound is suitably used as the first compound.

Furthermore, the first compound layer 12A is preferably oriented so that the transfer path may be disposed in the direction connecting the electrodes, because this facilitates the movement of the A ion in the first compound layer 12A.

Moreover, the first compound and the second compound preferably have the same lattice constant, because the orientation can be controlled easily to perform film-formation even in the case where a material that includes the void site and is difficult to film-form is used.

The second compound contains a transition element having a d-orbital partially filled with electron. Furthermore, the second compound layer 12B includes a void site capable of storing the A ion element having diffused from the first compound layer 12A. However, some or all of the void sites may already have been occupied by the A ion element having moved from the first compound layer 12A. Some of the void sites may be occupied by other ions in advance in order to facilitate the film-formation of the second compound layer 12B.

The second compound layer 12B has a resistivity not more than the resistivity of the first compound layer 12A in the low resistance state, both in the case where the recording layer 12 is in the low resistance state and in the case where it is in the high resistance state. For example, the second compound layer 12B has a resistivity of $10^{-1}$ Ωcm or less.

Compounds expressed by, for example, the following chemical formulae are given as specific examples of the second compound. The "Φ" in the formulae represents the void site.

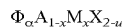

A is at least one element selected from the group consisting of Ti, Zr, Hf, and Sn. M is at least one element selected from the group consisting of V, Nb, Ta, Cr, Mo, W, As, Sb, and Bi. X is at least one element selected from the group consisting of O, N, and F. A and M are different elements. The molar ratio a satisfies $0.3 < \alpha \leq 2$, x of the molar ratios "1−x" and "x" satisfies $0.001 < x \leq 0.2$, and u of the molar ratio "2−u" satisfies $0 \leq u < 0.2$.

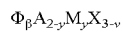

A is at least one element selected from the group consisting of V, Nb, Ta, Cr, Mo, W, Mn, Fe, Co, Ga, and In. M is at least one element selected from the group consisting of Ti, Zr, Hf, Sn, V, Nb, Ta, As, Sb, Bi, Cr, Mo, and W. X is at least one element selected from the group consisting of O, N, and F. A and M are different elements. The molar ratio β satisfies $0.3 < \beta \leq 2$, y of the molar ratios "2−y" and "y" satisfies $0.001 < y \leq 0.2$, and v of the molar ratio "3−v" satisfies $0 \leq v < 0.3$.

A is at least one element selected from the group consisting of V, Nb, and Ta. M is at least one element selected from the group consisting of Cr, Mo, and W. X is at least one element selected from the group consisting of O, N, and F. A and M are different elements. The molar ratio γ satisfies $0.3 < \gamma \leq 2$, z of the molar ratios "2−z" and "z" satisfies $0.001 < z \leq 0.2$, and w of the molar ratio "5−w" satisfies $0 \leq w < 0.5$.

The second compound preferably includes one of the corundum structure, rutile structure, ramsdellite structure, anatase structure, hollandite structure, brookite structure, and pyrolusite structure.

To achieve low power consumption, it is important to optimize the ion radius of the A ion and use a structure in which a transfer path exists so that the A ion can move in the crystal without causing crystal break.

Using a material and crystal structure like those described above for the second compound can meet such conditions, and is effective in achieving low power consumption.

The Fermi level of the electrons of the first compound layer 12A is set lower than the Fermi level of the electrons of the second compound layer 12B. This is one of the desired conditions for providing the state of the recording layer 12 with reversibility. Here, the Fermi levels are values measured from the vacuum level.

To further increase the resistance value of the device in the selective state (ON), an insulator that has a thickness of about several nanometers and the permeability of ions discharged from the first compound layer 12A may be placed between the first compound layer 12A and the second compound layer 12B in the recording layer formed as mentioned above. This insulator is a compound that contains at least the A ion element discharged from the first compound layer 12A and another transition element, and is preferably a complex oxide.

Next, a suitable range of the film thickness of the second compound layer 12B will now be described.

To obtain the effect of the A ion storage by the void site, the second compound 12B preferably has a film thickness of 1 nm or more.

On the other hand, if the number of void sites in the second compound layer 12B is larger than the number of A ions in the first compound layer 12A, the resistance change effect of the second compound layer 12B is small. Therefore, the number of void sites in the second compound layer 12B is preferably equal to or smaller than the number of A ions in the first compound layer 12A in the same cross-sectional area.

Since the density of the A ion in the first compound layer 12A and the density of the void site in the second compound layer 12B are almost the same, the second compound layer 12B preferably has a film thickness nearly equal to or smaller than the film thickness of the first compound layer 12A.

Generally, a heater layer (a material with a resistivity of about $10^{-5}$ Ωcm or more) for further accelerating the reset operation may be provided on the cathode side.

In a probe memory, since a reducing material deposits on the cathode side, a surface protection layer is preferably provided in order to prevent reaction with the air.

The heater layer and the surface protection layer may be formed of one material having both functions. For example, amorphous carbon, diamond-like carbon, and semiconductors such as $SnO_2$ have both a heater function and a surface protection function.

As illustrated in FIGS. 3A and 3B, the first compound layer 12A and the second compound layer 12B included in the recording layer 12 may be alternately stacked in a plurality.

The basic operation of the resistance-change information recording and reproducing device according to this specific example is as follows.

Also in this specific example, the initial state of the recording layer 12 is set to an insulator (the high resistance state phase), and the recording of information is performed by phase-changing the recording layer 12 by an electric potential gradient to provide the recording layer 12 with electrical conductivity (the low resistance state phase).

In the recording unit like this, when electric potentials are applied to the electrode layers 11 and 13A to generate an electric potential gradient in the recording layer 12 so that the first compound layer 12A becomes the anode side and the second compound layer 12B becomes the cathode side, some of the A ions in the first compound layer 12A containing the first compound move in the crystal to enter the second compound layer 12B on the cathode side.

Since there is the void site for the A ion in the crystal of the second compound layer 12B, the A ion having moved from the first compound layer 12A containing the first compound is stored in the void site.

In the second compound layer 12B, the number of cations becomes larger than the number of anions. That is, the chemical equivalent (number of moles×valence) of cation becomes larger than the chemical equivalent of anion. Accordingly, the second compound layer 12B receives electrons from the cathode in order to maintain electrical neutrality. Consequently, the valence of some of the A ions or the M2 ions in the second compound layer 12B decreases, and the second compound layer 12B becomes a compound layer with a low oxidation state.

On the other hand, in the first compound layer 12A, conversely, the number of cations becomes smaller than the number of anions. That is, the chemical equivalent of cation becomes smaller than the chemical equivalent of anion. Accordingly, the first compound layer 12A discharges electrons to the anode side in order to maintain electrical neutrality. Consequently, the valence of some of the A ions or the M1 ions in the first compound layer 12A increases, and the first compound layer 12A becomes a compound layer with a high oxidation state.

In other words, assuming that, in the initial state (reset state), the first compound layer 12A and the second compound layer 12B are in the high resistance state (insulator), some of the A ions in the first compound layer 12A move into the second compound layer 12B to produce electrically-conductive carriers in the crystals of the first compound layer 12A and the second compound layer 12B, and both are provided with electrical conductivity.

Thus, since the electric resistance value of the recording layer 12 becomes small by applying a current/voltage pulse to the recording layer 12, the set operation (recording) is performed.

As described above, at least one of the A ion and the M1 ion and at least one of the A ion and the M2 ion are a transition element having a d-orbital partially filled with electron so that the valence thereof can change easily. Therefore, such a operation becomes possible.

At the time of the set operation, also electrons move from the first compound layer 12A toward the second compound layer 12B. Since the Fermi level of the electrons of the second compound layer 12B is higher than the Fermi level of the electrons of the first compound layer 12A, the total energy of the recording layer 12 increases.

Here, since such a high energy state continues after the set operation is completed, the recording layer 12 may naturally turn from the set state (low resistance state) back to the reset state (high resistance state).

However, using the recording layer 12 according to the example of this embodiment allows keeping the set state. This is because what is called the ion transfer resistance is in effect. As described above, it is preferable for the information recording and reproducing device to set the coordination number of the A ion small (ideally, not more than two), or to set the valence thereof to divalence.

Since an oxidizing agent is generated on the anode side after the set operation is completed, also in this case, a material difficult to oxidize and having no ion conductivity (for example, electrically conductive oxide) is preferably used as the electrode layer 11. Suitable examples thereof are as described above.

The reset operation (erasing) may be performed by heating the recording layer 12 to accelerate a phenomenon in which the A ion stored in the void site of the second compound layer 12B described above goes back into the first compound layer 12A.

Specifically, the Joule heat generated by applying a large current pulse to the recording layer 12 and the residual heat thereof may be used. Thereby, the recording layer 12 can be easily turned back to the high resistance state (insulator). Since the recording layer 12 is low resistive, a large current flows even if the electric potential difference is small.

Thus, the electric resistance value of the recording layer 12 becomes large by applying a large current pulse to the recording layer 12. Thereby, the reset operation (erasing) is performed. That is, by thermal energy, a change can be produced from a high-energy metastable state raised by the set operation back to an insulative state which is a low-energy stable state before the set. Alternatively, the reset operation can be performed also by applying an electric field in the direction opposite to that in the set operation.

The reproducing can be performed easily by passing a current pulse through the recording layer 12 and detecting the resistance value of the recording layer 12. The current pulse may be set to a value minute enough not to cause the resistance change in the material of the recording layer 12.

As described above, the second compound layer 12B containing the second compound 12B including the void site that stores the A ion having diffused from the first compound layer 12A is provided in contact with the first compound layer 12A. Thereby, since the second compound layer 12B has the function of storing the A ion element discharged from the first compound layer 12A, ions can move smoothly and the diffused A ion elements can exist stably with ease. By using such a combination of materials for the recording layer to facilitate the transfer of ion between the first compound layer 12A and the second compound layer 12B, power consumption necessary for the resistance change can be reduced and thermal stability can be increased. Furthermore, using such a combination of materials for the recording layer can achieve a recording density of the Pbpsi (peta bit per square inch) class, and reduce power consumption.

Here, it is preferable that the first compound layer 12A and the second compound layer 12B resistance-change during the set operation and the reset operation. However, actually, there is a possibility that only one of these compound layers changes resistance (performs switching) at times other than these operations. For example, in the case where an electric field is applied to one cell to switch it to the low resistance state and then an electric field in the opposite direction is applied to another cell adjacent to the one cell to perform the erase operation, there is a possibility that an oppositely-oriented electric field of a low voltage is applied to the one cell. In this case, for example, the second compound layer 12B may experience a structural change to cause a change in the resistance state into the high resistance state. This may result in a not-intended operating mode, specifically, a false write, rewrite, or the like (these are referred to as a "disturb").

However, using the second compound of this specific example resolves this problem. That is, by limiting the composition range by making the x, y, and z larger than 0.001 like the specific examples of the second compound described above, these compounds always have electric conductivities of 10 S/cm or more irrespective of the entering and exiting of the A ion. Furthermore, by limiting the composition range by making the x, y, and z not more than 0.2 as mentioned above, the stability of crystal structure is retained. By thus configuring, the second compound layer 12B does not contribute to switching, and the switching is performed solely by the first compound layer 12A. Resistance to disturb in the case where a voltage is applied in the opposite direction increases. Thereby, stable operation can be obtained.

As described above, this embodiment can facilitate the diffusion of cation (A ion) elements by using the material described above for the recording layer 12, and can reduce power consumption necessary for the resistance change and increase thermal stability. Furthermore, a recording density of the Pbpsi (peta bit per square inch) class can be achieved. Furthermore, since the resistance change is produced by using the diffusion of cation elements in the crystal structure, this embodiment facilitates the control of operating characteristics and reduces variation in operating characteristics between cells. Moreover, using the second compound described above provides good disturb resistance; thereby, an information recording and reproducing device capable of stable operation is provided.

Application examples of the information recording and reproducing device according to this embodiment will now be described.

Three cases will be described: the case where the recording unit according to this embodiment is used for a probe memory; the case where it is used for a semiconductor memory; and the case where it is used for a flash memory.

Probe Memory

Figure 4:
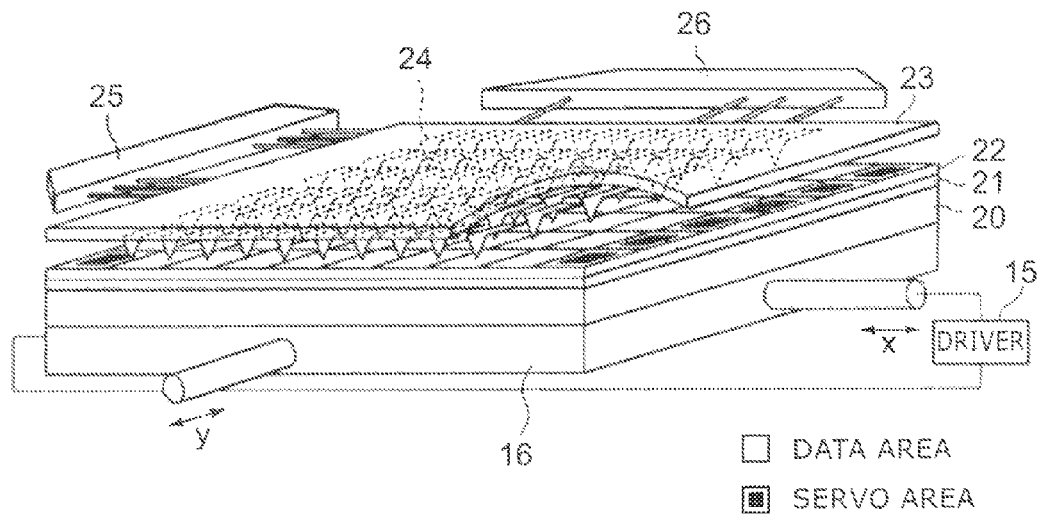
FIG. 4 and FIG. 5 are schematic views illustrating a probe memory according to the embodiment.
Figure 5:
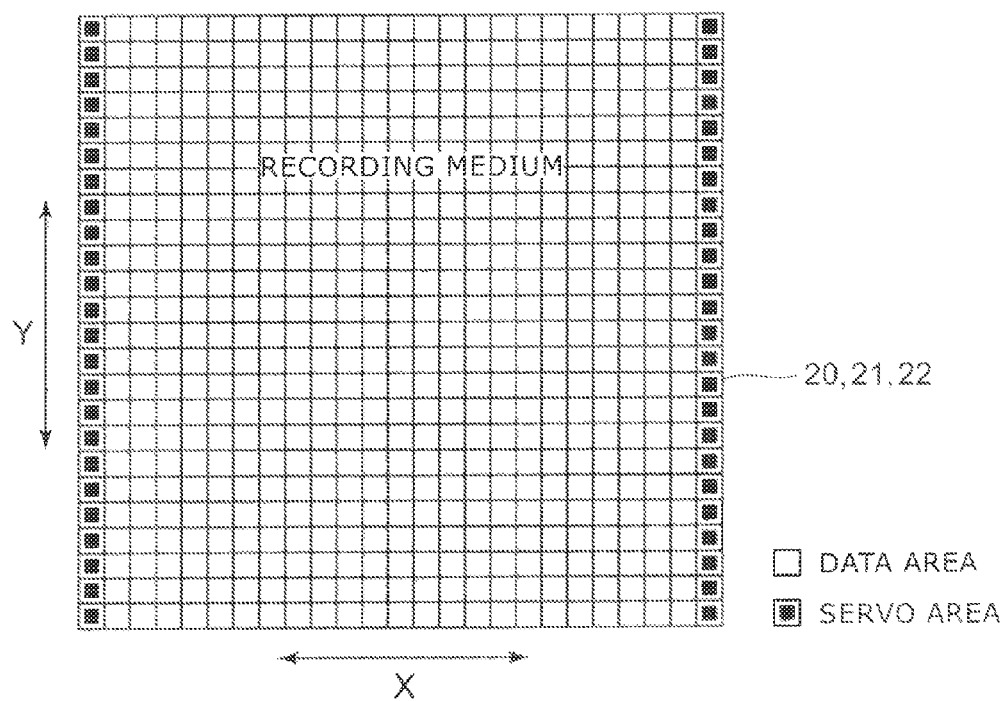

FIG. 4 and FIG. 5 are schematic views illustrating a probe memory according to this embodiment.

A recording medium in which the recording unit of this embodiment is provided is disposed on an XY scanner 16. A probe array is disposed opposite to the recording medium.

The probe array includes: a substrate 23; and a plurality of probes (heads) 24 disposed in an array form on one side of the substrate 23. Each of the plurality of probes 24 is formed of, for example, a cantilever, and is driven by multiplex drivers 25 and 26.

The plurality of probes 24 can be operated individually by using a micro actuator in the substrate 23. Here, an example is described in which all the probes 24 are collectively caused to perform the same operation to access the data areas of the recording medium.

First, all the probes 24 are reciprocated in the X direction with a constant period by using the multiplex drivers 25 and 26 to read out the positional information in the Y direction from servo areas of the recording medium. The positional information in the Y direction is transmitted to a driver 15.

The driver 15 drives the XY scanner 16 based on the positional information to move the recording medium in the Y direction to perform the positioning of the recording medium and the probes.

When the positioning of both is completed, the readout or writing of data is performed for all the probes 24 on/above the data areas simultaneously and continuously.

Since the probes 24 reciprocate in the X direction, the readout and writing of data are continuously performed. The readout and writing of data are performed one line at a time for the data areas by successively changing the position in the Y direction of the recording medium.

It is also possible to reciprocate the recording medium in the X direction with a constant period to read out the positional information from the recording medium and to move the probes 24 in the Y direction.

The recording medium is formed of, for example, a substrate 20, an electrode layer 21 on the substrate 20, and a recording layer 22 on the electrode layer 21.

The recording layer 22 includes: the plurality of data areas; and the servo areas disposed on both sides in the X direction of the plurality of data areas. The plurality of data areas occupy the main part of the recording layer 22.

A servo burst signal is recorded in the servo area. The servo burst signal indicates the positional information in the Y direction in the data areas.

In addition to the areas for the above information, an address area in which address data are recorded and a preamble area for synchronizing are disposed in the recording layer 22.

The data and the servo burst signal are recorded in the recording layer 22 as a recording bit (electric resistance variation). The "1" and "0" data of the recording bit are read out by detecting the electric resistance of the recording layer 22.

In this example, one probe (head) is provided for one data area, and one probe is provided for one servo area.

The data area is formed of a plurality of tracks. The track of the data area is identified through an address signal read out from the address area. The servo burst signal read out from the servo area is a signal for moving the probe 24 to the center of the track to eliminate read errors of the recording bit.

Here, the head position control technology of HDD can be utilized by relating the X direction to the down track direction and the Y direction to the track direction.

Next, the recording/reproducing operation of the probe memory will now be described.

Figure 6:
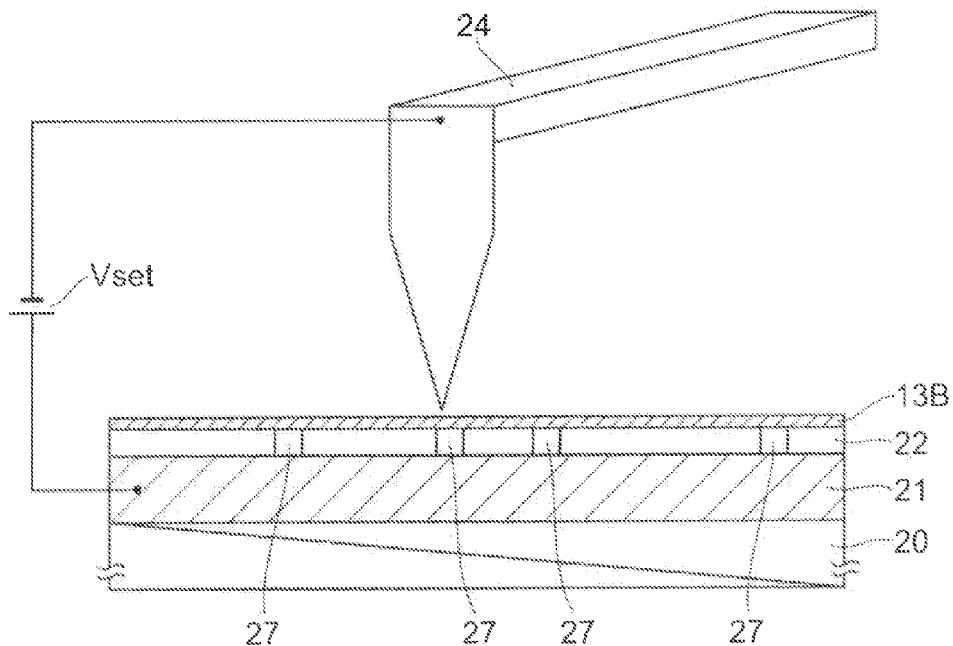
FIG. 6 is a conceptual view for describing the state at the time of recording (set operation) in the probe memory according to the embodiment.

FIG. 6 is a conceptual view for describing the state at the time of recording (set operation).

The recording medium is formed of: the electrode layer on the substrate (e.g. a semiconductor chip) 20; the recording layer 22 on the electrode layer 21; and a protection layer 13B on the recording layer 22. The protection layer 13B is formed of, for example, a thin insulator.

The recording operation is performed by applying a voltage to the surface of a recording bit 27 of the recording layer 22 to generate an electric potential gradient in the recording bit 27. Specifically, a current/voltage pulse may be applied to the recording bit 27.

The Case Where the Recording Unit Described Above in Regard to FIGS. 1A and 1B is Used Here, the case will now be described where the recording unit described above in regard to FIGS. 1A and 1B is used.

Figure 7:
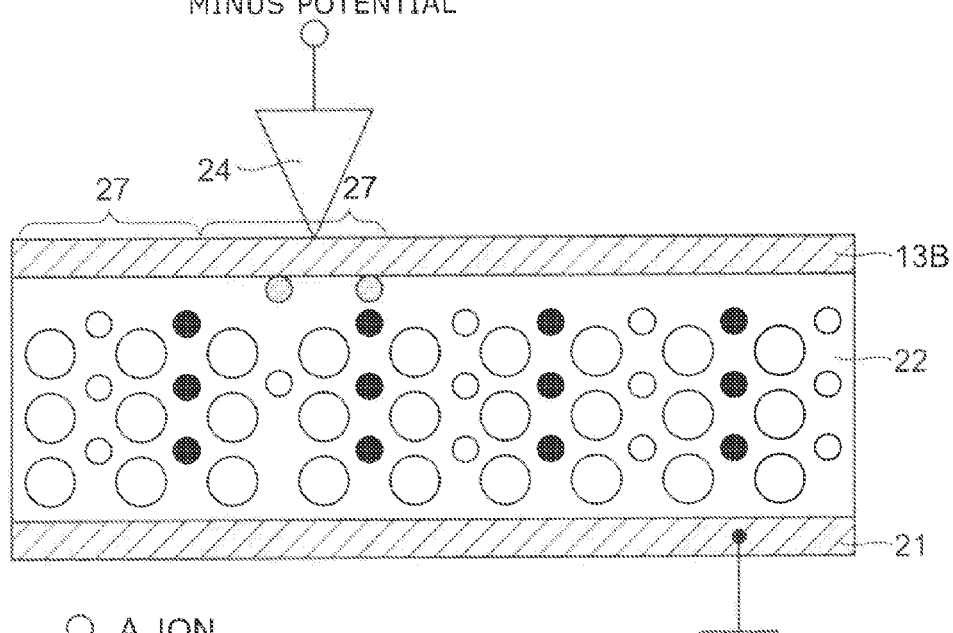
FIG. 7 is a schematic view illustrating the recording operation in a probe memory according to embodiment.

FIG. 7 is a schematic view illustrating the recording.

First, as illustrated in FIG. 7, a state is created in which the electric potential of the probe 24 is lower than the electric potential of the electrode layer 21. Assuming that the electrode layer 21 is set at a fixed potential (e.g. the ground potential), a negative potential may be applied to the probe 24.

The current pulse is generated by, for example, using an electron generation source or a hot electron source to emit electrons from the probe 24 toward the electrode layer 21. Alternatively, the probe 24 may be caused to be in contact with the surface of the recording bit 27 to apply a voltage pulse.

At this time, for example, in the recording bit 27 of the recording layer 22, some of the A ions move to the probe (cathode) 24 side, and the number of A ions in the crystal decreases relative to the number of X ions. Furthermore, the A ion having moved to the probe 24 side receives an electron(s) from the probe 24 to deposit as a metal.

In the recording bit 27, the X ion becomes surplus, and this results in increasing the valence of the A ion or the M ion in the recording bit 27. In other words, since the recording bit 27 is provided with electron conductivity by carrier injection due to the phase change, the resistance in the film thickness direction decreases and the recording (set operation) is completed.

The current pulse for recording may be generated also by creating a state in which the electric potential of the probe 24 is higher than the electric potential of the electrode layer 21.

Figure 8:
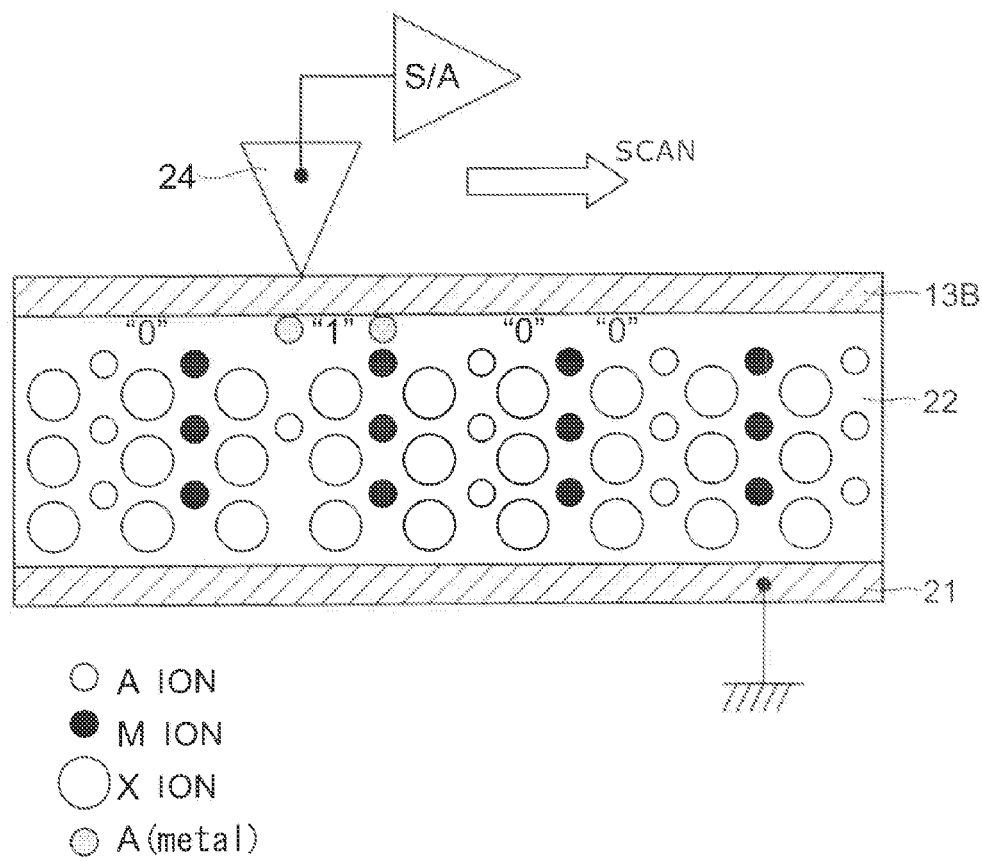
FIG. 8 is a schematic view illustrating the reproducing operation in the probe memory of the embodiment.

FIG. 8 is a schematic view illustrating the reproducing.

The reproducing is performed by passing a current pulse through the recording bit 27 of the recording layer 22 and detecting the resistance value of the recording bit 27. However, the current pulse has a value minute enough not to cause the resistance change in the material of the recording bit 27 of the recording layer 22.

For example, a readout current (current pulse) generated by a sense amplifier S/A is passed from the probe 24 to the recording bit 27, and the resistance value of the recording bit 27 is measured with the sense amplifier S/A.

If the material according to the embodiments described above in regard to FIGS. 1A and 1B is used, a ratio of the resistance values in the reset/set states of $10^3$ or more can be ensured.

In regard to the reproducing, continuous reproducing becomes possible by scanning the recording medium with the probe 24.

The erase (reset) operation is performed by Joule-heating the recording bit 27 of the recording layer 22 with a large current pulse to accelerate the oxidation reduction reaction in the recording bit 27. Alternatively, a pulse that provides an electric potential difference in the direction opposite to that in the set operation may be applied.

The erase operation may be performed for each recording bit 27, or for a plurality of recording bits 27 or a block as a unit.

The Case Where the Recording Unit Described Above in Regard to FIGS. 2A and 2B is Used Next, the case will now be described where the recording unit described above in regard to FIGS. 2A and 2B is used.

Figure 9:
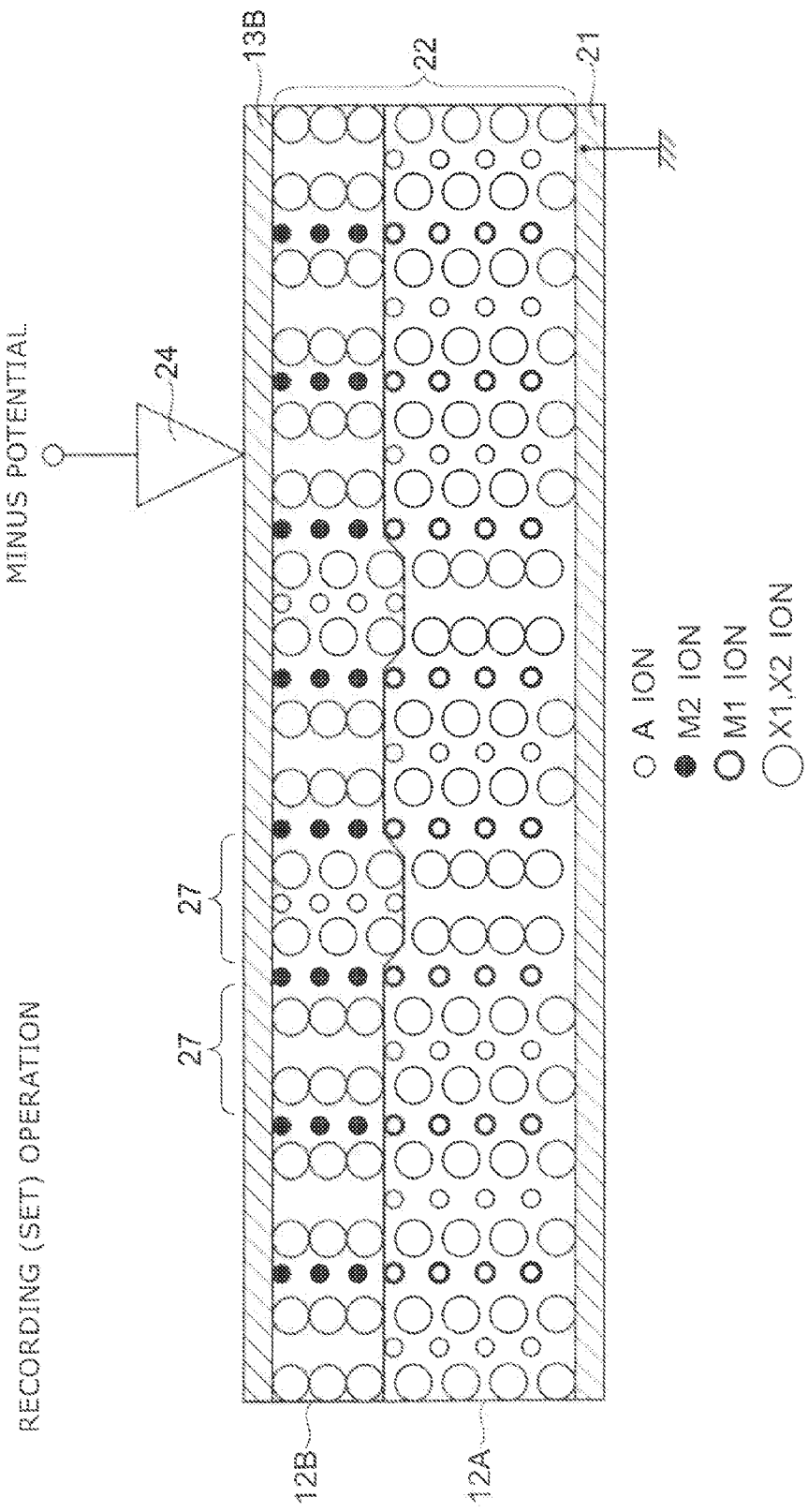
FIG. 9 is a schematic view illustrating the recording operation in a probe memory including the recording unit shown in FIG. 2.

FIG. 9 is a schematic view illustrating the recording state.

First, as illustrated in FIG. 9, a state is created in which the electric potential of the probe 24 is lower than the electric potential of the electrode layer 21. Assuming that the electrode layer 21 is set at a fixed potential (e.g. the ground potential), a negative potential may be applied to the probe 24.

At this time, some of the A ions in the first compound layer (anode side) 12A of the recording layer 22 move in the crystal to be stored in the void sites of the second compound layer (cathode side) 12B. As a result of this, the valence of the A ion or the M1 ion in the first compound layer 12A increases, and the valence of the A ion or the M2 ion in the second compound layer 12B decreases. Consequently, an electrically conductive carrier is produced in the crystals of the first compound layer 12A and the second compound layer 12B, and both are provided with electrical conductivity.

Thereby, the set operation (recording) is completed.

In the recording operation, if the positional relation of the first compound layer 12A and the second compound layer 12B is reversed, the set operation can be performed by making the electric potential of the probe 24 higher than the electric potential of the electrode layer 21.

Figure 10:
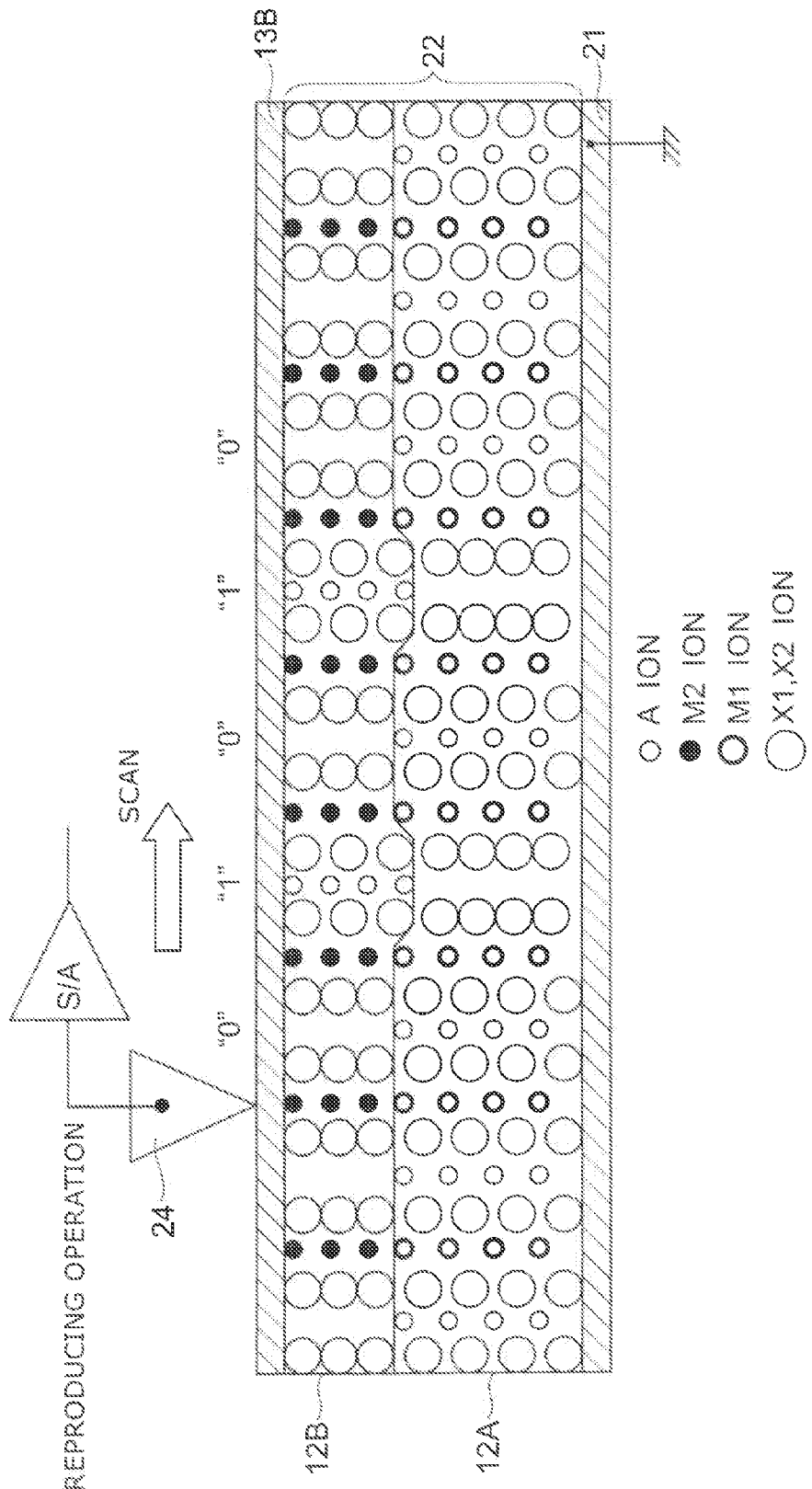
FIG. 10 is a schematic view illustrating the reproducing operation in a probe memory including the recording unit shown in FIG. 2.

FIG. 10 is a schematic view illustrating the state at the time of reproducing.

The reproducing operation is performed by passing a current pulse through the recording bit 27 and detecting the resistance value of the recording bit 27. However, the current pulse has a value minute enough not to cause the resistance change in the material of the recording bit 27.

For example, a readout current (current pulse) generated by the sense amplifier S/A is passed from the probe 24 to the recording layer (recording bit) 22, and the resistance value of the recording bit is measured with the sense amplifier S/A. Using the new material described above can ensure a ratio of the resistance values in the reset/set states of $10^3$ or more.

The reproducing operation can be performed continuously by scanning with the probe 24.

The reset (erase) operation may be performed by using the Joule heat generated by passing a large current pulse through the recording layer (recording bit) 22 and the residual heat thereof to accelerate the action of the A ion returning from the void site in the second compound layer 12B into the first compound layer 12A. Alternatively, a pulse that provides an electric potential difference in the direction opposite to that in the set operation may be applied.

The erase operation may be performed for each recording bit 27, or for a plurality of recording bits 27 or a block as a unit.

As described above, the probe memory of this embodiment can achieve a higher recording density and lower power consumption than current hard disks and flash memory.

In the case where the recording layer described above in regard to FIGS. 2A and 2B or FIGS. 3A and 3B is used for the recording layer 22, the effects described above are obtained. That is, ions can move smoothly and the diffused ion elements can exist stably with ease. Thereby, power consumption necessary for the resistance change can be reduced and thermal stability can be increased. Furthermore, a material having electrical conductivity throughout times before and after operation may be used for the second compound layer 12B. Thereby, the switching is performed solely by the first compound layer 12A, and disturb resistance is appropriately ensured. That is, the stability of operation is ensured.

Semiconductor Memory

Next, an information recording and reproducing device combined with a semiconductor device will now be described.

Figure 11:
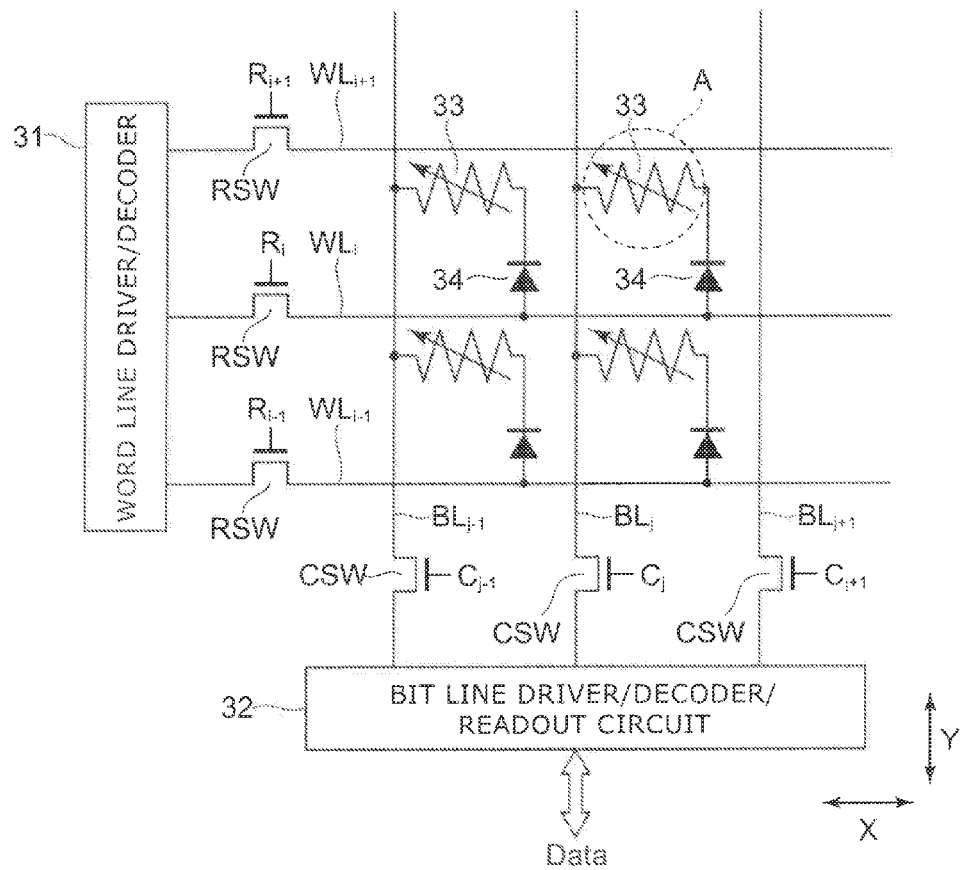
FIG. 11 is a schematic diagram illustrating a cross-point semiconductor memory including the recording layer according to the embodiment.

FIG. 11 is a schematic diagram illustrating a cross-point semiconductor memory including the recording layer of this embodiment.

Word lines $WL_{i-1}$, $WL_i$, and $WL_{i+1}$ extend in an X direction and bit lines $BL_{j-1}$, $BL_j$, and $BL_{j+1}$ extend in a Y direction.

One ends of the word lines $WL_{i-1}$, $WL_i$, and $WL_{i+1}$ are connected to a word line driver/decoder 31 via MOS transistors RSW as selection switches, and one ends of the bit lines $BL_{j-1}$, $BL_j$, and $BL_{j+1}$ are connected to a bit line driver/decoder/readout circuit 32 via MOS transistors CSW as selection switches.

Selection signals $R_{i-1}$, $R_i$, and $R_{i+1}$ for selecting one word line (row) are inputted to the gates of the MOS transistors RSW, and selection signals $C_{j-1}$, $C_j$, and $C_{j+1}$ for selecting one bit line (column) are inputted to the gates of the MOS transistors CSW.

A memory cell 33 is disposed at the intersections of the word lines $WL_{i-1}$, $WL_i$, and $WL_{i+1}$ and the bit lines $BL_{j-1}$, $BL_j$, and $BL_{j+1}$. This is what is called a cross-point cell array structure.

A diode 34 for suppressing a sneak current during recording/reproducing is added to the memory cell 33.

Figure 12:
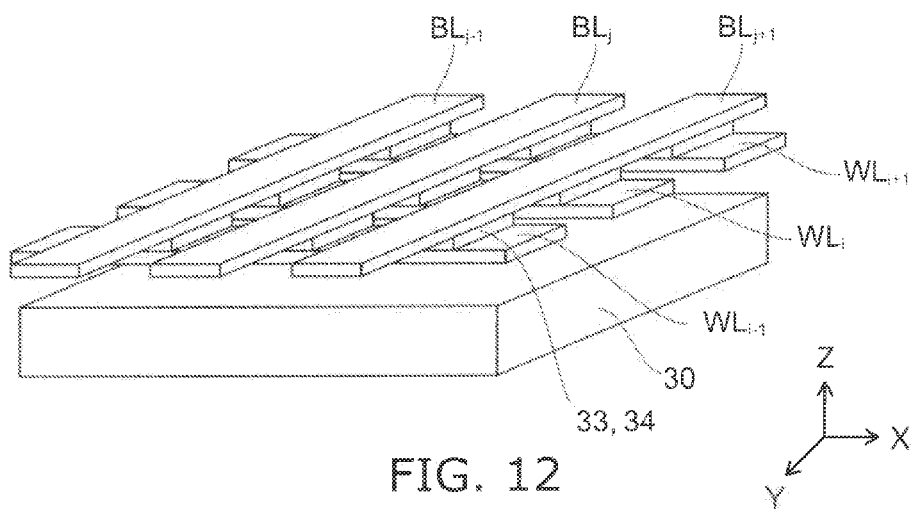
FIG. 12 is a schematic view illustrating the structure of the memory cell array unit of the semiconductor memory shown in FIG. 11.

FIG. 12 is a schematic view illustrating the structure of the memory cell array unit of the semiconductor memory shown in FIG. 11.

The word lines $WL_{i-1}$, $WL_i$, and $WL_{i+1}$ and the bit lines $BL_{j-1}$, $BL_j$, and $BL_{j+1}$ are disposed on a semiconductor chip 30, and the memory cell 33 and the diode 34 are disposed at the intersections of these interconnections. A not-illustrated barrier layer may be provided between the diode 34 and the word line ($WL_i$ etc.).

Such a cross-point cell array structure is advantageous to high integration because it is not necessary to connect a MOS transistor individually to the memory cell 33. For example, as illustrated in FIG. 14 and FIG. 15, it is also possible to stack memory cells 33 to construct a three-dimensional memory cell array.

Figure 13:
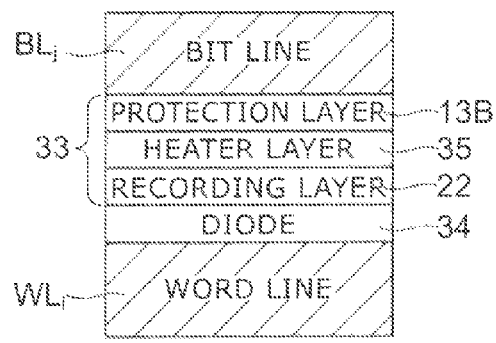
FIG. 13 is a schematic view illustrating the structure of the memory cell of the semiconductor memory shown in FIG. 11.

The memory cell 33 including the recording layer of this embodiment is formed of, for example, a stacked structure of the recording layer 22, a protection layer 13B, and a heater layer 35 as illustrated in FIG. 13. One memory cell 33 stores one bit data. The diode 34 is disposed between the word line $WL_i$ and the memory cell 33. As described above, a not-illustrated barrier layer may be provided between the diode 34 and the word line ($WL_i$ etc.).

Figure 14:
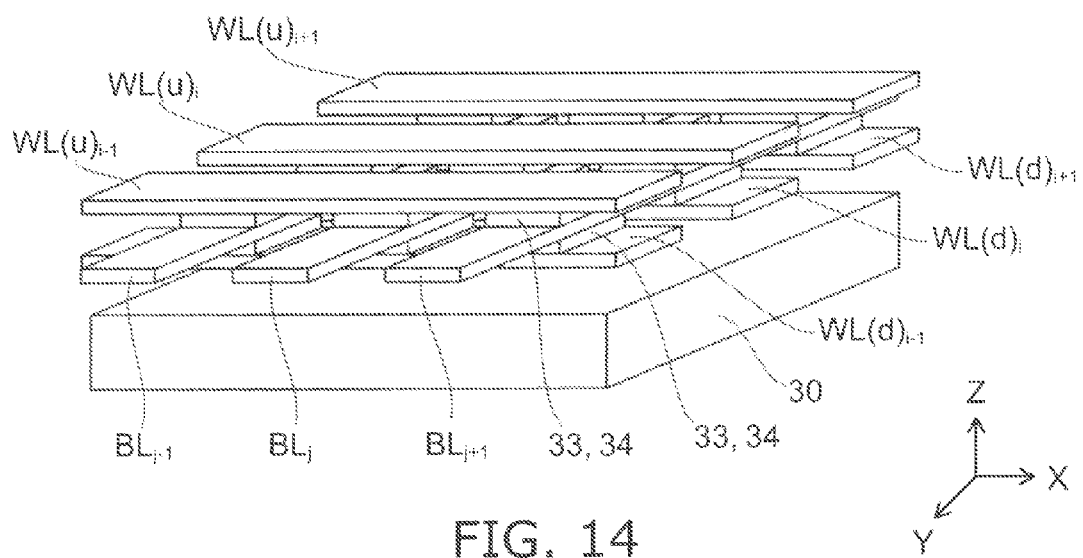
FIG. 14 and FIG. 15 are schematic views illustrating other specific examples of the memory cell array unit shown in FIG. 11.
Figure 15:
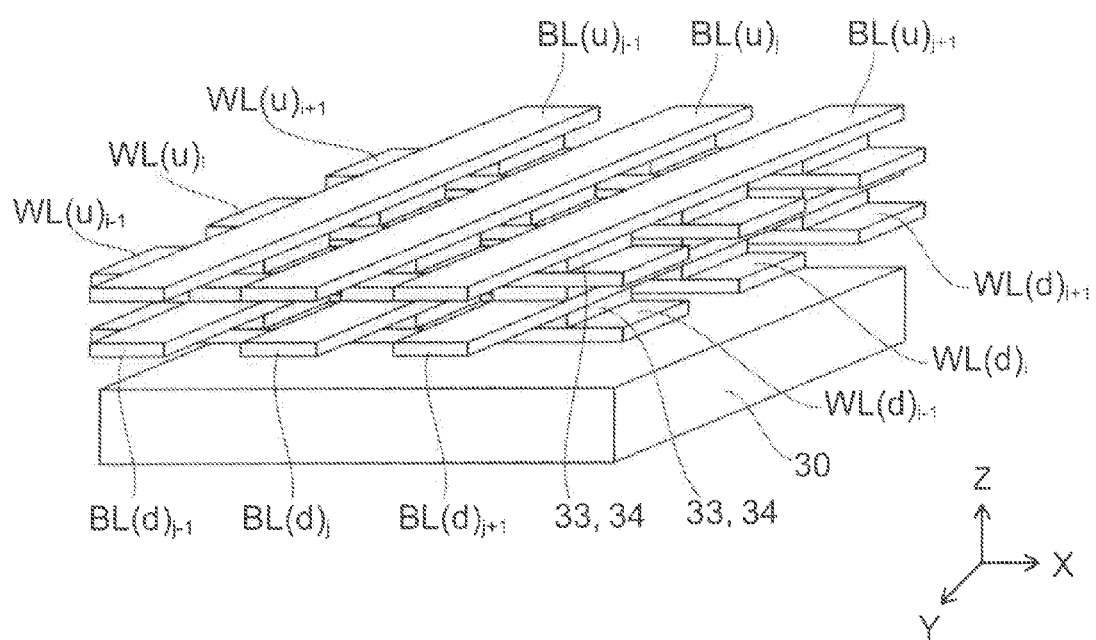

FIG. 14 and FIG. 15 are schematic views illustrating other specific examples of the memory cell array.

In the specific example illustrated in FIG. 14, the word lines $WL_{i-1}$, $WL_i$, and $WL_{i+1}$ extending in the X direction are provided above and below the bit lines $BL_{j-1}$, $BL_j$, and $BL_{j+1}$ extending in the Y direction. The memory cell 33 and the diode 34 are disposed at each of the cross-points of these bit lines and word lines. In other words, this is a structure in which the bit line is shared between the memory cells thereabove and therebelow. A not-illustrated barrier layer may be provided between the diode 34 and the word line ($WL(d)_i$ etc.) and between the diode 34 and the bit line ($BL_j$ etc.).

The specific example illustrated in FIG. 15 has a structure in which the bit lines $BL_{j-1}$, $BL_j$, and $BL_{j+1}$ extending in the Y direction and the word lines $WL_{i-1}$, $WL_i$, and $WL_{i+1}$ extending in the X direction are alternately stacked. The memory cell 33 and the diode 34 are disposed at each of the cross-points of these bit lines and word lines. In other words, this is a structure in which the bit line and the word line are shared between the memory cells thereabove and therebelow. A not-illustrated barrier layer may be provided between the diode 34 and the word line ($WL(d)_i$ etc.), between the diode 34 and the bit line ($BL(d)_j$), and between the diode 34 and the word line ($WL(u)_i$ etc.).

Using a stacked structure like those illustrated in FIG. 14 and FIG. 15 allows increasing the recording density.

Next, the recording/reproducing operation of the semiconductor memory using the recording layer of this embodiment will now be described with reference to FIG. 11 to FIG. 13.

Here, the case will now be described where the memory cell 33 surrounded by a dotted line "A" in FIG. 11 is selected and the recording/reproducing operation is performed in this cell.

The Case Where the Recording Layer Described Above in Regard to FIGS. 1A and 1B is Used The recording (set operation) may be performed by applying a voltage to the selected memory cell 33 to generate an electric potential gradient in the memory cell 33 to pass a current pulse therethrough. Therefore, a state is created in which, for example, the electric potential of the word line $WL_i$ is lower than the electric potential of the bit line $BL_j$. Assuming that the bit line $BL_j$ is set at a fixed potential (e.g. the ground potential), a negative potential may be applied to the word line $WL_i$.

At this time, in the selected memory cell 33 surrounded by the dotted line "A", some of the A ions move to the word line (cathode) $WL_i$ side, and the number of A ions in the crystal decreases relative to the number of X ions. Furthermore, the A ion having moved to the word line $WL_i$ side receives an electron(s) from the word line $WL_i$ to deposit as a metal.

In the selected memory cell 33 surrounded by the dotted line "A", the X ion becomes surplus, and this results in increasing the valence of the A ion or the M ion in the crystal. In other words, the selected memory cell 33 surrounded by the dotted line "A" is provided with electron conductivity by carrier injection due to the phase change, and the recording (set operation) is thereby completed.

At the time of recording, all the not-selected word lines $WL_{i-1}$ and $WL_{i+1}$ and all the not-selected bit lines $BL_{j-1}$ and $BL_{j+1}$ are preferably biased to the same electric potential.

At the time of standby before recording, all the word lines $WL_{i-1}$, $WL_i$, and $WL_{i+1}$ and all the bit lines $BL_{j-1}$, $BL_j$, and $BL_{j+1}$ are preferably precharged.

The current pulse for recording may be generated also by creating a state in which the electric potential of the word line $WL_i$ is higher than the electric potential of the bit line $BL_j$.

The reproducing is performed by passing a current pulse through the selected memory cell 33 surrounded by the dotted line "A" and detecting the resistance value of the memory cell 33. The current pulse may be set to a value minute enough not to cause the resistance change in the material of the memory cell 33.

For example, a readout current (current pulse) generated by the readout circuit is passed from the bit line $BL_j$ to the memory cell 33 surrounded by the dotted line "A", and the resistance value of the memory cell 33 is measured with the readout circuit. Using the new material described above can ensure a ratio of the resistance values in the reset/set states of $10^3$ or more.

The erasing (reset) operation is performed by Joule-heating the selected memory cell 33 surrounded by the dotted line "A" with a large current pulse to accelerate the oxidation reduction reaction in the memory cell 33.

The Case Where the Recording Layer Described Above in Regard to FIG. 2A and FIG. 2B is Used The recording operation (set operation) may be performed by applying a voltage to the selected memory cell 33 to generate an electric potential gradient in the memory cell 33 to pass a current pulse therethrough. Therefore, for example, the electric potential of the word line $WL_i$ is made lower than the electric potential of the bit line $BL_j$. Assuming that the bit line $BL_j$ is set at a fixed potential (e.g. the ground potential), a negative potential may be applied to the word line $WL_i$.

At this time, in the selected memory cell 33 surrounded by the dotted line "A", some of the A ions in the first compound layer 12A move to the void sites of the second compound layer 12B. Accordingly, the valence of the A ion or the M2 ion in the second compound layer 12A decreases, and the valence of the A ion or the M1 ion in the first compound layer 12A increases. Consequently, an electrically conductive carrier is produced in the crystals of the first compound layer 12A and the second compound layer 12B, and both are provided with electrical conductivity.

Thereby, the set operation (recording) is completed.

At the time of recording, all the not-selected word lines $WL_{i-1}$ and $WL_{i+1}$ and all the not-selected bit lines $BL_{j-1}$ and $BL_{j+1}$ are preferably biased to the same electric potential.

At the time of standby before recording, all the word lines $WL_{i-1}$, $WL_i$, and $WL_{i+1}$ and all the bit lines $BL_{j-1}$, $BL_j$, and $BL_{j+1}$ are preferably precharged.

The current pulse may be generated also by creating a state in which the electric potential of the word line $WL_i$ is higher than the electric potential of the bit line $BL_j$.

The reproducing operation is performed by passing a current pulse through the selected memory cell 33 surrounded by the dotted line "A" and detecting the resistance value of the memory cell 33. The current pulse may be set to a value minute enough not to cause the resistance change in the material of the memory cell 33.

For example, a readout current (current pulse) generated by the readout circuit is passed from the bit line $BL_j$ to the memory cell 33 surrounded by the dotted line "A", and the resistance value of the memory cell 33 is measured with the readout circuit. Using the new material described above can ensure a ratio of the resistance values in the reset/set states of $10^3$ or more.

The reset (erase) operation is performed by using the Joule heat generated by passing a large current pulse through the selected memory cell 33 surrounded by the dotted line "A" and the residual heat thereof to accelerate the action of the A ion element returning from the void site in the second compound layer 12B into the first compound layer 12A.

As described above, the semiconductor memory of this embodiment can achieve a higher recording density and lower power consumption than current hard disks and flash memory.

In the case where the recording layer described above in regard to FIGS. 2A and 2B or FIGS. 3A and 3B is used for the recording layer 22, ions can move smoothly and the diffused ion elements can exist stably with ease. Thereby, power consumption necessary for the resistance change can be reduced and thermal stability can be increased. Furthermore, a material having electrical conductivity throughout times before and after operation may be used for the second compound layer 12B. Thereby, the switching is performed solely by the first compound layer 12A, and disturb resistance is appropriately ensured. That is, the stability of operation is ensured.

Flash Memory

This embodiment can be also used for a flash memory.

Figure 16:
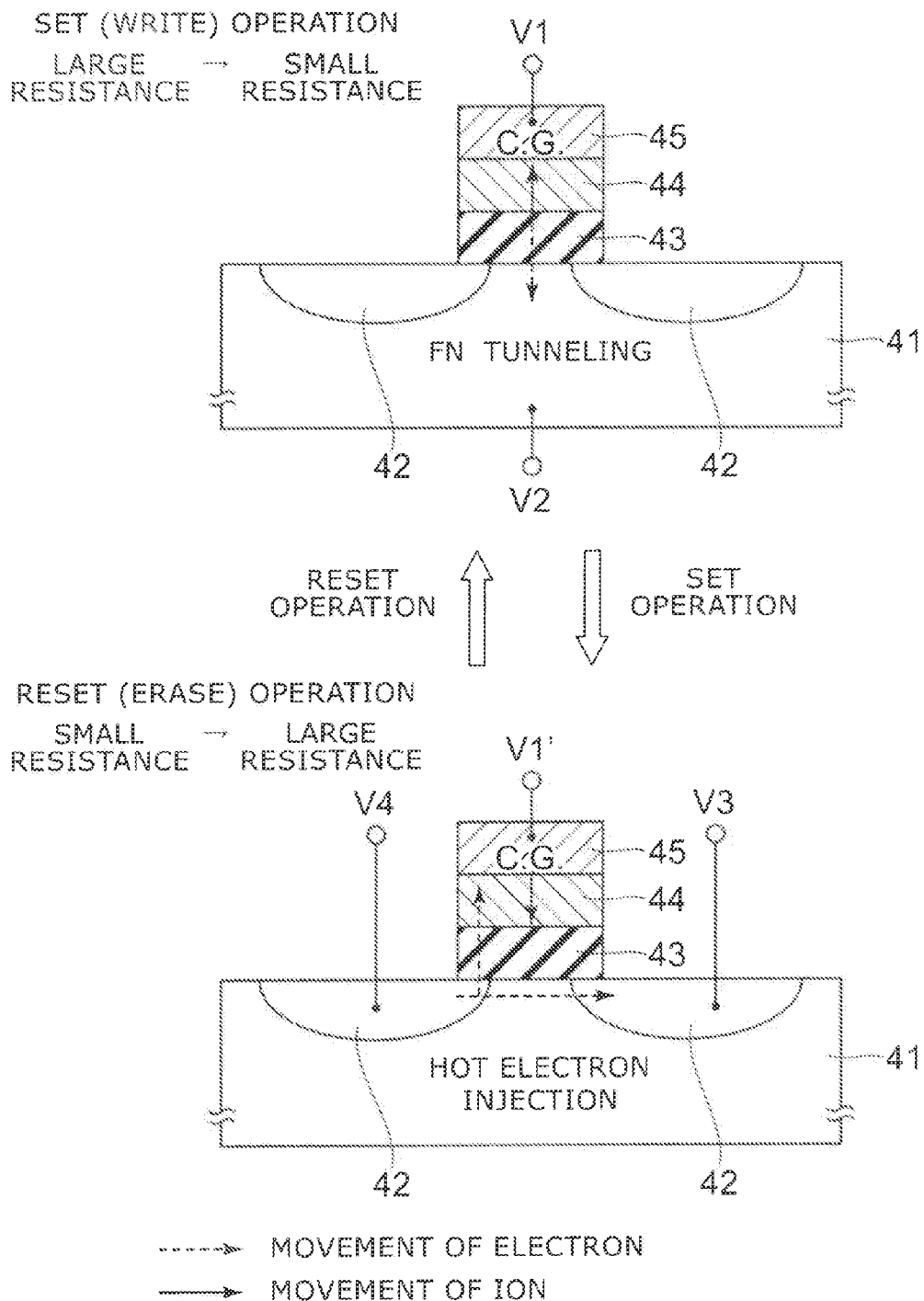
FIG. 16 is a schematic cross-sectional view illustrating a memory cell of a flash memory according to the embodiment.

FIG. 16 is a schematic cross-sectional view illustrating a memory cell of a flash memory.

The memory cell of the flash memory is formed of a MIS (metal-insulator-semiconductor) transistor.

Diffusion layers 42 are formed in the surface region of a semiconductor substrate 41. A gate insulating layer 43 is formed on the channel region between the diffusion layers 42. A recording layer (RRAM: resistive RAM) 44 of this embodiment is formed on the gate insulating layer 43. A control gate electrode 45 is formed on the recording layer 44.

The semiconductor substrate 41 may be a well region, and the semiconductor substrate 41 and the diffusion layer 42 have mutually opposite electrical conductivity types. The control gate electrode 45 forms a word line, and is formed of, for example, a conductive polysilicon.

The recording layer 44 is formed of the material of the recording layer 12 described above in regard to FIG. 1A to FIG. 3B.

The basic operation of the device will now be described with reference to FIG. 16.

The set (write) operation is performed by applying an electric potential V1 to the control gate electrode 45 and applying an electric potential V2 to the semiconductor substrate 41.

The difference between the electric potentials V1 and V2 is large enough to phase-change or resistance-change the recording layer 44. The direction thereof is not limited.

That is, either V1>V2 or V1<V2 is possible.

For example, assuming that the recording layer 44 is an insulator (resistance being large) in the initial state (reset state), the gate insulating layer 43 is substantially thick, and therefore the threshold of the memory cell (MIS transistor) is high.

If the recording layer 44 is changed from this state to a conductor (resistance being small) by applying the electric potentials V1 and V2, the gate insulating layer 43 becomes substantially thin, and therefore the threshold of the memory cell (MIS transistor) becomes low.

Although the electric potential V2 was applied to the semiconductor substrate 41, instead the electric potential V2 may be transmitted from the diffusion layer 42 to the channel region of the memory cell.

The reset (erase) operation is performed by applying an electric potential V1' to the control gate electrode 45, applying an electric potential V3 to one of the diffusion layers 42, and applying an electric potential V4 (<V3) to the other of the diffusion layers 42.

The electric potential V1' is set to a value exceeding the threshold of the memory cell in the set state.

At this time, the memory cell becomes ON, electrons flow from the other of the diffusion layers 42 toward the one, and hot electrons are generated. Since the hot electrons are injected into the recording layer 44 via the gate insulating layer 43, the temperature of the recording layer 44 increases.

Thereby, the recording layer 44 changes from the conductor (resistance being small) to the insulator (resistance being large). Therefore, the gate insulating layer 43 becomes substantially thick, and the threshold of the memory cell (MIS transistor) becomes high.

Thus, the threshold of the memory cell can be changed by a similar operation to flash memory. Therefore, the information recording and reproducing device according to the example of this embodiment can be put to practical use by utilizing the technology of flash memory.

NAND Flash Memory

Figure 17:
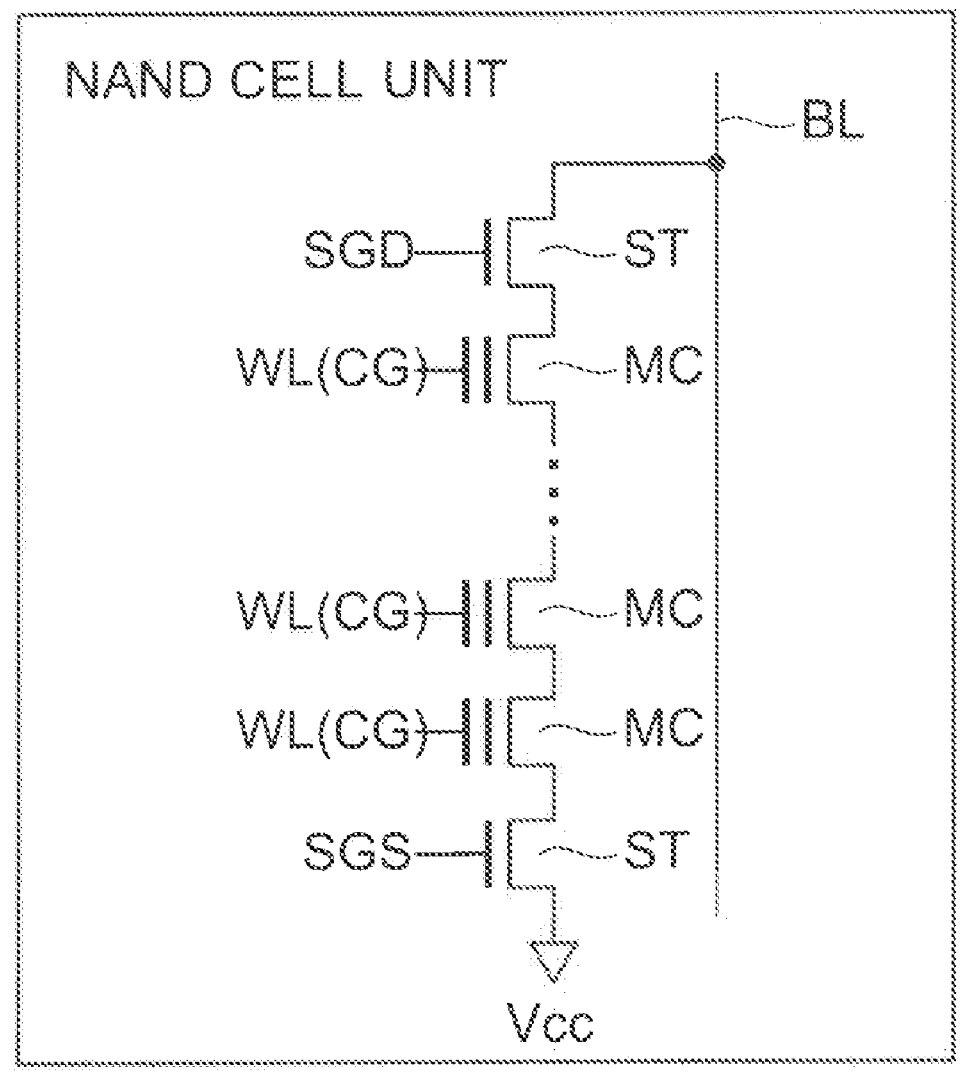
FIG. 17 is a circuit diagram of a NAND cell unit according to the embodiment.

FIG. 17 is a circuit diagram of a NAND cell unit.

Figure 18:
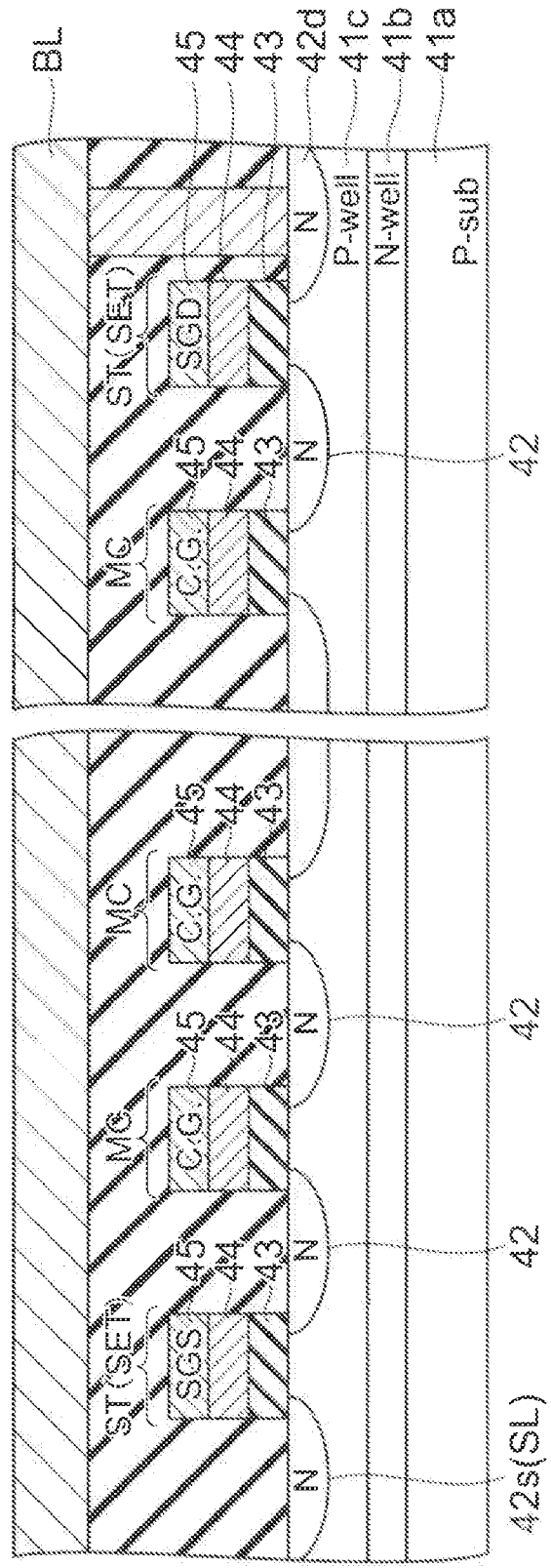
FIG. 18 to FIG. 20 are schematic views illustrating the structure of a NAND cell unit according to the embodiment.

FIG. 18 is a schematic view illustrating the structure of a NAND cell unit according to this embodiment.

An N-type well region 41b and a P-type well region 41c are formed in a P-type semiconductor substrate 41a. A NAND cell unit according to an example of this embodiment is formed in the P-type well region 41c.

The NAND cell unit is formed of: a NAND string including a plurality of memory cells MC connected in series; and a total of two selection gate transistors ST connected to both ends of the NAND string one by one.

The memory cell MC and the selection gate transistor ST have the same structure. Specifically, these each are formed of: the N-type diffusion layers 42; the gate insulating layer 43 on the channel region between the N-type diffusion layers 42; the recording layer (RRAM) 44 on the gate insulating layer 43; and the control gate electrode 45 on the recording layer 44.

The state (insulator/conductor) of the recording layer 44 of the memory cell MC can be changed by the basic operation described above. In contrast, the recording layer 44 of the selection gate transistor ST is kept in the set state, namely, a conductor (resistance being small).

One of the selection gate transistors ST is connected to a source line SL, and the other is connected to a bit line BL.

It is assumed that, before the set (write) operation, all the memory cells in the NAND cell unit are in the reset state (resistance being large).

The set (write) operation is performed successively from the memory cell MC on the source line SL side toward the memory cell on the bit line BL side one by one.

V1 (a plus potential) is applied to the selected word line (control gate electrode) WL as a write potential, and Vpass is applied to the not-selected word line WL as a transmission potential (an electric potential at which the memory cell MC becomes ON).

The selection gate transistor ST on the source line SL side is switched to OFF, the selection gate transistor ST on the bit line BL side is switched to ON, and program data is transmitted from the bit line BL to the channel region of the selected memory cell MC.

For example, when the program data is "1", a write inhibit potential (for example, an electric potential of approximately V1) is transmitted to the channel region of the selected memory cell MC so that the resistance value of the recording layer 44 of the selected memory cell MC may not change from a high level to a low level.

Furthermore, when the program data is "0", V2 (<V1) is transmitted to the channel region of the selected memory cell MC to change the resistance value of the recording layer 44 of the selected memory cell MC from a high level to a low level.

In the reset (erase) operation, for example, V1' is applied to all the word lines (control gate electrodes) WL to switch all the memory cells MC in the NAND cell unit to ON. Furthermore, the two selection gate transistors ST are switched to ON, V3 is applied to the bit line BL, and V4 (<V3) is applied to the source line SL.

At this time, since hot electrons are injected into the recording layers 44 of all the memory cells MC in the NAND cell unit, the reset operation is performed collectively for all the memory cells MC in the NAND cell unit.

The readout operation is performed by applying a readout potential (plus potential) to the selected word line (control gate electrode) WL and applying an electric potential at which the memory cell MC always becomes ON irrespective of the data "0" or "1" to the not-selected word line (control gate electrode) WL.

Furthermore, the two selection gate transistors ST are switched to ON, and a readout current is supplied to the NAND string.

Since the selected memory cell MC becomes ON or OFF in accordance with the value of the data stored therein when the readout potential is applied, the data can be read out by, for example, detecting the change of the readout current.

Figure 19:
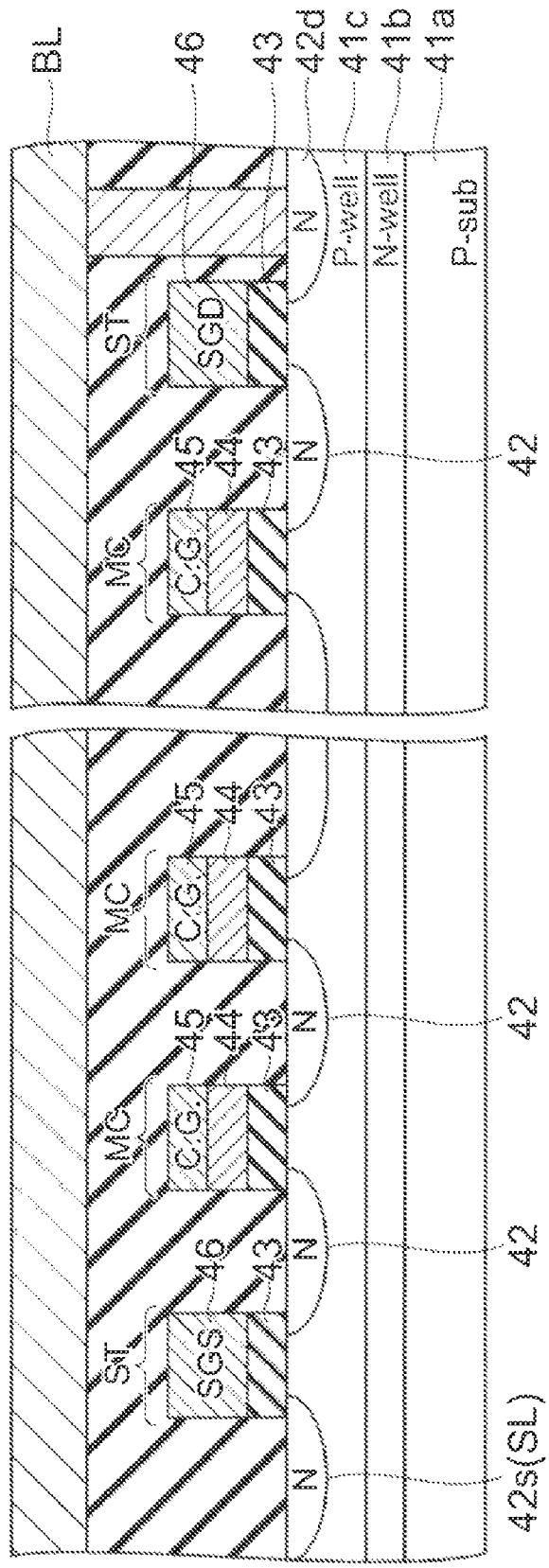

Although the selection gate transistor ST has the same structure as the memory cell MC in the structure illustrated in FIG. 18, the selection gate transistor ST may be a common MIS transistor without forming the recording layer as illustrated in FIG. 19, for example.

Figure 20:
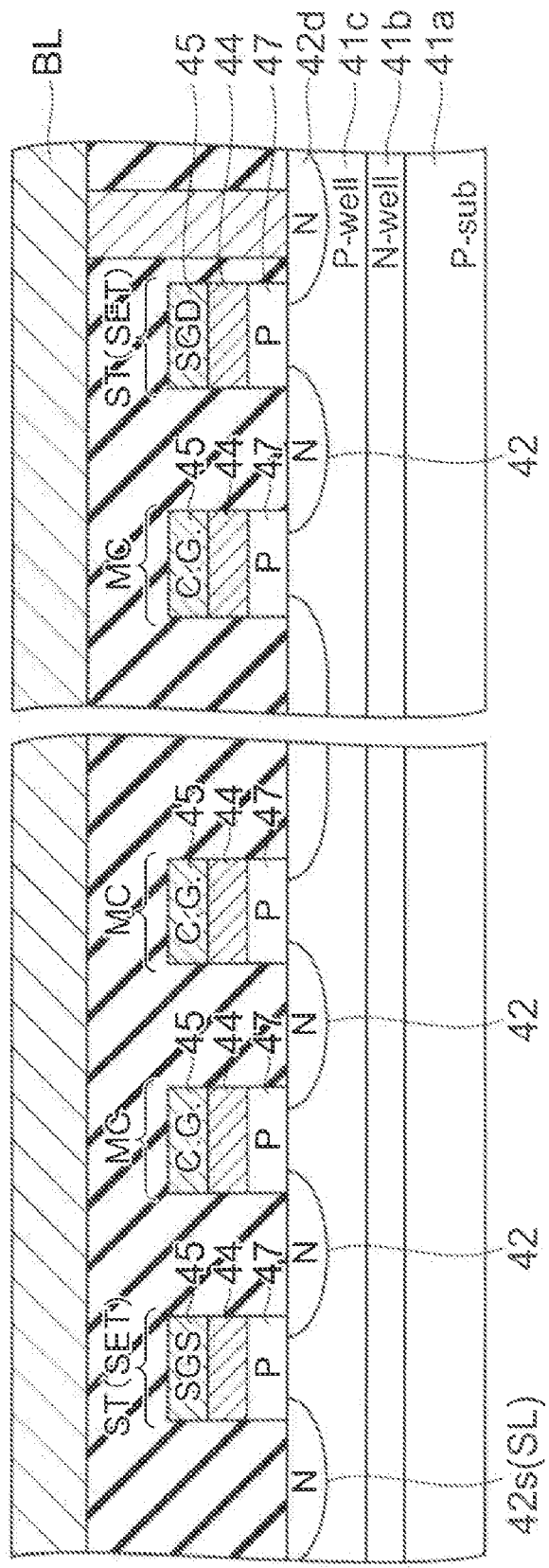

FIG. 20 is a schematic view illustrating a variation of the NAND flash memory.

This variation has a structure in which the gate insulating layers of the plurality of memory cells MC included in the NAND string are replaced with P-type semiconductor layers 47.

If high integration progresses and the memory cell MC is downsized, the P-type semiconductor layer 47 is filled with a depletion layer in a state in which no voltage is applied.

At the time of set (writing), a plus write potential (e.g. 3.5 V) is applied to the control gate electrode 45 of the selected memory cell MC, and a plus transmission potential (e.g. 1 V) is applied to the control gate electrode 45 of the not-selected memory cell MC.

At this time, the surfaces of the P-type well regions 41c of the plurality of memory cells MC in the NAND string are reversed from the P type to the N type and channels are formed.

Accordingly, as described above, the set operation can be performed by switching the selection gate transistor ST on the bit line BL side to ON and transmitting the program data "0" from the bit line BL to the channel region of the selected memory cell MC.

The reset (erasing) can be performed collectively for all the memory cells MC included in the NAND string by, for example, applying a minus erase potential (e.g. −3.5 V) to all the control gate electrodes 45 and applying the ground potential (0 V) to the P-type well region 41c and the P-type semiconductor layer 47.

At the time of readout, a plus readout potential (e.g. 0.5 V) is applied to the control gate electrode 45 of the selected memory cell MC, and a transmission potential (e.g. 1 V) at which the memory cell MC always becomes ON irrespective of the data "0" or "1" is applied to the control gate electrode 45 of the not-selected memory cell MC.

However, the threshold voltage Vth"1" of the memory cell MC in the "1" state satisfies 0 V<Vth"1"<0.5 V, and the threshold voltage Vth"0" of the memory cell MC in the "0" state satisfies 0.5 V<Vth"0"<1 V.

Furthermore, the two selection gate transistors ST are switched to ON, and a readout current is supplied to the NAND string.

In such a state, the amount of the current flowing through the NAND string changes in accordance with the value of the data stored in the selected memory cell MC, and the data can be thus read out by detecting the change.

In this variation, the hole doping amount of the P-type semiconductor layer 47 is preferably larger than that of the P-type well region 41c, and the Fermi level of the P-type semiconductor layer 47 is preferably deeper than that of the P-type well region 41c by about 0.5 V.

This is in order that, when a plus potential is applied to the control gate electrode 45, the inversion from the P type to the N type may start from the surface portion of the P-type well region 41c between the N-type diffusion layers 42 to form a channel.

In this way, for example, the channel of the not-selected memory cell MC is formed at the interface between the P-type well region 41c and the P-type semiconductor layer 47 during writing, and the channels of the plurality of memory cells MC in the NAND string are formed at the interface between the P-type well region 41c and the P-type semiconductor layer 47 during readout.

In other words, even if the recording layer 44 of the memory cell MC is a conductor (in the set state), the diffusion layer 42 and the control gate electrode 45 do not short-circuit.

NOR Flash Memory

Figure 21:
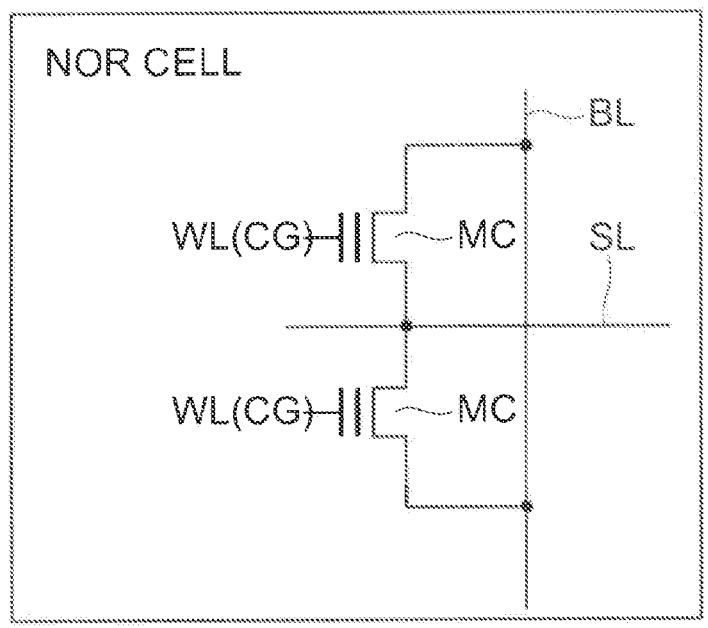
FIG. 21 is a circuit diagram of a NOR cell unit according to the embodiment.

FIG. 21 is a circuit diagram of a NOR cell unit.

Figure 22:
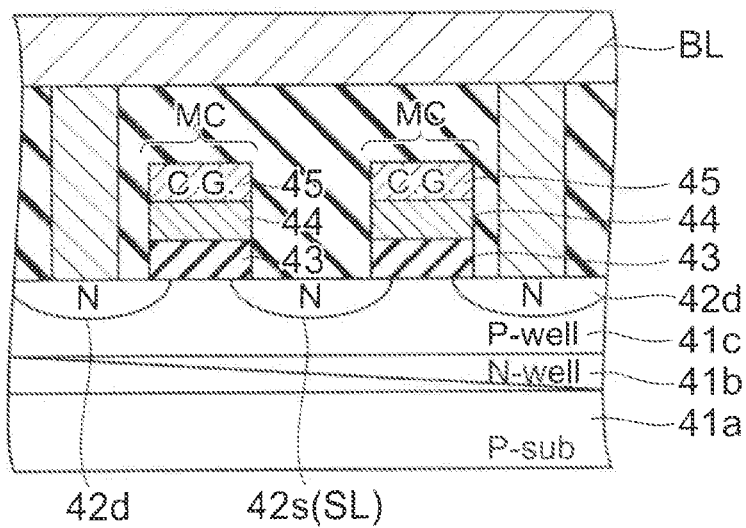
FIG. 22 is a schematic view illustrating the structure of a NOR cell unit according to the embodiment.

FIG. 22 is a schematic view illustrating the structure of a NOR cell unit according to an example of this embodiment.

The N-type well region 41b and the P-type well region 41c are formed in the P-type semiconductor substrate 41a. A NOR cell according to an example of this embodiment is formed in the P-type well region 41c.

The NOR cell is formed of one memory cell (MIS transistor) MC connected to the bit line BL and the source line SL.

The memory cell MC is formed of: the N-type diffusion layers 42; the gate insulating layer 43 on the channel region between the N-type diffusion layers 42; the recording layer (RRAM) 44 on the gate insulating layer 43; and the control gate electrode 45 on the recording layer 44. The state (insulator/conductor) of the recording layer 44 of the memory cell MC can be changed by the basic operation described above.

Two-Transistor Flash Memory

Figure 23:
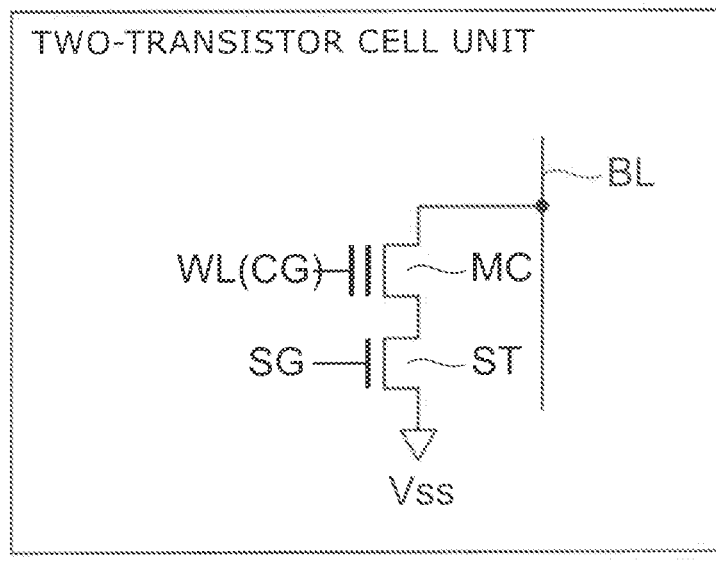
FIG. 23 is a circuit diagram of a two-transistor cell unit according to the embodiment.

FIG. 23 is a circuit diagram of a two-transistor cell unit.

Figure 24:
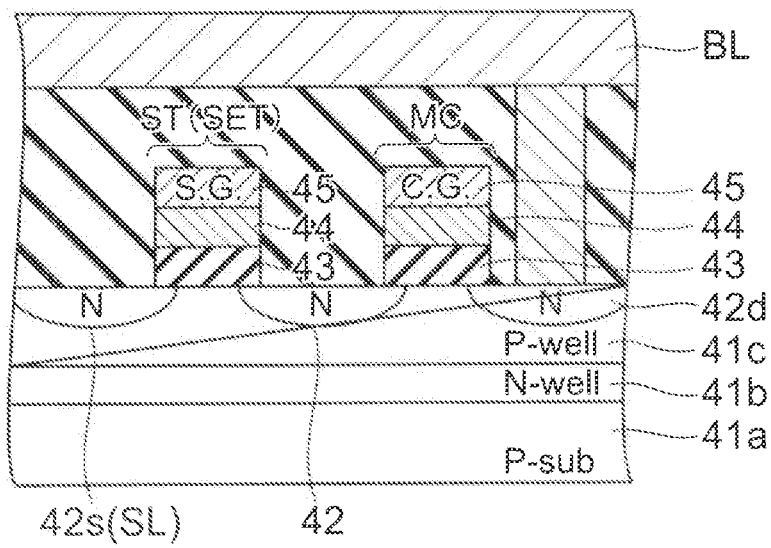
FIG. 24 to FIG. 25 are schematic views illustrating the specific example of a two-transistor cell unit according to the embodiment.

FIG. 24 is a schematic view illustrating the structure of a two-transistor cell unit according to this embodiment.

The two-transistor cell unit has been recently developed as a new cell structure that has both the feature of the NAND cell unit and that of the NOR cell.

The N-type well region 41b and the P-type well region 41c are formed in the P-type semiconductor substrate 41a. The two-transistor cell unit according to an example of this embodiment is formed in the P-type well region 41c.

The two-transistor cell unit is formed of one memory cell MC and one selection gate transistor ST connected in series.

The memory cell MC and the selection gate transistor ST have the same structure. Specifically, these each are formed of: the N-type diffusion layers 42; the gate insulating layer 43 on the channel region between the N-type diffusion layers 42; the recording layer (RRAM) 44 on the gate insulating layer 43; and the control gate electrode 45 on the recording layer 44.

The state (insulator/conductor) of the recording layer 44 of the memory cell MC can be changed by the basic operation described above. In contrast, the recording layer 44 of the selection gate transistor ST is kept in the set state, namely, a conductor (resistance being small).

The selection gate transistor ST is connected to the source line SL, and the memory cell MC is connected to the bit line BL.

Figure 25:
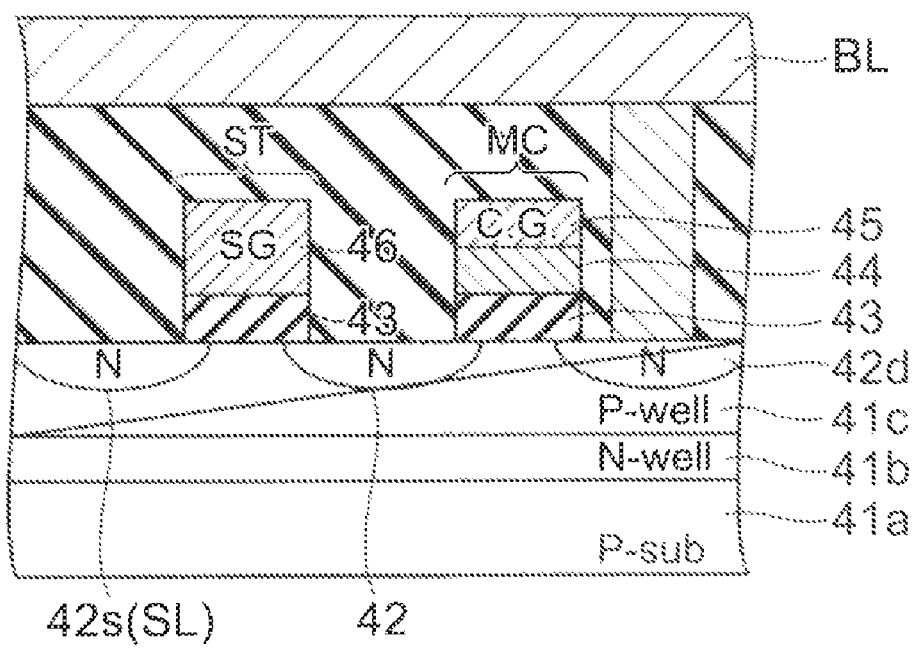

Although the selection gate transistor ST has the same structure as the memory cell MC in the structure illustrated in FIG. 24, the selection gate transistor ST may be a common MIS transistor without forming the recording layer as illustrated in FIG. 25, for example.

Other than the above, the materials and operations presented by this embodiment may be used for recording media such as current hard disks and DVDs.

In these flash memories, in the case where the recording layer described above in regard to FIGS. 2A and 2B or FIGS. 3A and 3B is used for the recording layer 44, ions can move smoothly and the diffused ion elements can exist stably with ease. Thereby, power consumption necessary for the resistance change can be reduced and thermal stability can be increased. Furthermore, a material having electrical conductivity throughout times before and after operation may be used for the second compound layer 12B. Thereby, the switching is performed solely by the first compound layer 12A, and disturb resistance is appropriately ensured. That is, the stability of operation is ensured.

Next, a method for manufacturing a recording medium according to the embodiment of the invention will now be described.

Here, a description is given by dealing with the structure of the recording medium illustrated in FIG. 6 as an example.

A disk made of glass having a diameter of about 60 mm and a thickness of about 1 mm is used as the substrate 20. On the substrate 20 like this, Pt (platinum) is deposited with a thickness of about 500 nm to form the electrode layer 21.

On the electrode layer 21, first, a target with a composition having been adjusted so that TiN may be deposited is used to perform film-formation by using an RF power source with a power having been adjusted so as to obtain the (110) orientation. Subsequently, a target with a composition having been adjusted so that $ZnMn_2O_4$ may be deposited is used to perform RF magnetron sputtering in an atmosphere with a temperature of 300 to 600° C. and a composition of 95% Ar (argon) and 5% $O_2$ (oxygen) to form $ZnMn_2O_4$ with a thickness of about 10 nm, which forms part of the recording layer 22.

Subsequently, $TiO_2$ with a thickness of about 3 nm is formed on the $ZnMn_2O_4$ by RF magnetron sputtering. Consequently, the recording layer 22 has a stacked structure of $ZnMn_2O_4$ and $TiO_2$.

Finally, the protection layer 13B is formed on the recording layer 22. Thus, a recording medium like that illustrated in FIG. 6 is completed.

EXPERIMENTAL EXAMPLES

Next, experimental examples will now be described in which some samples are prepared and the resistance difference between the reset (erase) state and the set (write) state is investigated.

A recording medium having the structure illustrated in FIG. 5 is used as a sample. The investigation is performed by using a probe pair having narrowed tips with a diameter of 10 nm or less.

The probe pair is caused to be in contact with the protection layer 13B, and the writing/erasing is performed by using one of the probe pair. The writing is performed by, for example, applying a voltage pulse of 1 V with a width of 10 nsec to the recording layer 22. The erasing is performed by, for example, applying a voltage pulse of 0.2 V with a width of 100 nsec to the recording layer 22.

Furthermore, between writing and erasing, the readout is performed by using the other of the probe pair. The readout is performed by applying a voltage pulse of 0.1 V with a width of 10 nsec to the recording layer 22 and measuring the resistance value of the recording layer (recording bit) 22.

First Experimental Example

The specifications of the sample of a first experimental example are as follows.

The recording layer 22 is formed of a stacked structure that includes $Zn_{1.1}Mn_{1.9}O_4$ with a thickness of about 10 nm and $Ti_{0.9}Nb_{0.1}O_2$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Second Experimental Example

The specifications of the sample of a second experimental example are as follows.

The recording layer 22 is formed of a stacked structure that includes $ZnCo_2O_4$ with a thickness of about 10 nm and $Ti_{0.9}Nb_{0.1}O_2$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Third Experimental Example

The specifications of the sample of a third experimental example are as follows.

The recording layer 22 is formed of a stacked structure that includes $ZnMn_2O_4$ with a thickness of about 10 nm and $Ti_{0.9}Nb_{0.1}O_2$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Fourth Experimental Example

The specifications of the sample of a fourth experimental example are as follows.

The recording layer 22 is formed of a stacked structure that includes $ZnCo_2O_4$ with a thickness of about 10 nm and $Zr_{0.9}Nb_{0.1}NF$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Fifth Experimental Example

The specifications of the sample of a fifth experimental example are as follows.

The recording layer 22 is formed of a stacked structure that includes $ZnMnO_3$ with a thickness of about 10 nm and $Hf_{0.98}Mo_{0.02}NF$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Sixth Experimental Example

The specifications of the sample of a sixth experimental example are as follows.

The recording layer 22 is formed of a stacked structure that includes $ZnMoO_3$ with a thickness of about 10 nm and $Zr_{0.98}Nb_{0.02}O_2$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Seventh Experimental Example

The specifications of the sample of a seventh experimental example are as follows.

The recording layer 22 is formed of a stacked structure that includes $ZnNbN_2$ with a thickness of about 10 nm and $Nb_{0.95}Mo_{0.05}ON$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Eighth Experimental Example

The specifications of the sample of an eighth experimental example are as follows.

The recording layer 22 is formed of a stacked structure that includes $ZnTaN_2$ with a thickness of about 10 nm and $TaON_{0.98}$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Ninth Experimental Example

The specifications of the sample of a ninth experimental example are as follows.

The recording layer 22 is formed of a stacked structure that includes $ZnMn_2O_4$ with a thickness of about 10 nm and $Nb_{1.95}Mo_{0.05}O_5$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Tenth Experimental Example

The specifications of the sample of a tenth experimental example are as follows.

The recording layer 22 is formed of a stacked structure that includes $ZnCo_2O_4$ with a thickness of about 10 nm and $Ta_{1.98}W_{0.02}O_5$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Eleventh Experimental Example

The specifications of the sample of an eleventh experimental example are as follows.

The recording layer 22 is formed of a stacked structure that includes $ZnFe_2O_4$ with a thickness of about 10 nm and $Ta_{1.98}W_{0.02}O_5$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Twelfth Experimental Example

The specifications of the sample of a twelfth experimental example are as follows.

The recording layer 22 is formed of a stacked structure that includes $ZnFe_2O_4$ with a thickness of about 10 nm and $Ga_{1.99}Ti_{0.01}O_3$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Thirteenth Experimental Example

The specifications of the sample of a thirteenth experimental example are as follows.

The recording layer 22 is formed of a stacked structure that includes $MgMn_2O_4$ with a thickness of about 10 nm and $In_{1.99}Hf_{0.01}O_3$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Fourteenth Experimental Example

The specifications of the sample of a fourteenth experimental example are as follows.

The recording layer 22 is formed of a stacked structure that includes $MgMn_2O_4$ with a thickness of about 10 nm and $Ga_{1.01}Ti_{0.99}O_2N$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Fifteenth Experimental Example

The specifications of the sample of a fifteenth experimental example are as follows.

The recording layer 22 is formed of a stacked structure that includes $MgMoO_3$ with a thickness of about 10 nm and $Nb_{1.95}Mo_{0.05}O_4F$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +1 V, and the set voltage in the bipolar operation is about −2.5 V.

Comparative Example

The specifications of the sample of a comparative example are as follows.

The recording layer 22 is formed of a stacked structure that includes $Zn_{1.1}Mn_{1.9}O_4$ with a thickness of about 10 nm and $TiO_2$ with a thickness of about 5 nm.

In this case, the result is expected that the reset voltage in the unipolar operation is about +0.5 V, and the set voltage in the unipolar operation is about +1.5 V. Furthermore, the result is expected that the reset voltage in the bipolar operation is about +0.5 V, and the set voltage in the bipolar operation is about −1.0 V.

As described above, in all of the samples of the first to fifteenth experimental examples, the absolute value of the voltage at the time of set in the bipolar operation is higher than the absolute value of the voltage at the time of set in the unipolar operation. On the other hand, in the comparative example, the absolute value of the set voltage in the bipolar operation is lower than the absolute value of the set voltage in the unipolar operation. This indicates that the experimental examples according to this embodiment are superior to the comparative example in resistance to reverse bias which may be applied to a not-selected cell in a device such as a crosspoint cell.

FIG. 26 is a table illustrating expectation values of the first to fifteenth experimental examples and the comparative example.

As described above, according to embodiments of the invention, since the information recording (writing) is performed in a portion (recording unit) to which an electric field is applied, information can be recorded in a very minute region with very low power consumption. This enables simultaneous parallel processing of a large number of cells and very high speed operation per chip.

Furthermore, although the erasing is performed by applying heat, using the material presented by examples of this embodiment causes almost no structural change of oxide, and therefore the erasing can be performed with low power consumption. Alternatively, the erasing can be performed also by applying an electric field in the direction opposite to that at the time of recording. In this case, since energy loss, that is, thermal diffusion is small, the erasing can be performed with lower power consumption.

Furthermore, according to this embodiment, since a conductive portion is formed in an insulator after writing, a current flows concentratedly through the conductor portion during readout, and recording with a very high sensing efficiency can be performed.

Furthermore, according to this embodiment, an easily movable cation and a transition element ion that stably retains the matrix structure are combined, and thereby the recording and erasing can be repeated stably.

Moreover, in the case where the recording layer described above in regard to FIGS. 2A and 2B or FIGS. 3A and 3B is used for the recording layer, ions can move smoothly and the diffused ion elements can exist stably with ease. Thereby, power consumption necessary for the resistance change can be reduced and thermal stability can be increased. Furthermore, a material having electrical conductivity throughout times before and after operation may be used for the second compound layer 12B. Thereby, the switching is performed solely by the first compound layer 12A, and disturb resistance is appropriately ensured. That is, the stability of operation is ensured.

Thus, examples of this embodiment enable information recording at a recording density that cannot be achieved by conventional technology, and enable high-speed operations, in spite of a very simple mechanism. Therefore, the examples of this embodiment are highly advantageous to industry as next-generation technology that breaks through the recording density barrier of current nonvolatile memory.

Examples of this embodiment are not limited to the embodiments described above, but may be embodied with alteration of the components without departing from the purport of this embodiment. The examples of this embodiment define the set and reset by taking the state immediately after film-formation as the initial state. However, the definition of the set and reset is optional, and is not limited to the examples of this embodiment. Furthermore, various inventions can be designed by appropriately combining the plurality of components disclosed in the embodiments described above. For example, some of all the components disclosed in the embodiments described above may be removed, or components of different embodiments may be appropriately combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. An information recording and reproducing device comprising:
    a first interconnection extending in a first direction;
    a second interconnection extending in a second direction intersecting with the first interconnection; and
    a stacked body including a first layer, a second layer, and a recording layer, the stacked body being provided between the first interconnection and the second interconnection at an intersection of the first interconnection and the second interconnection and being supplied with a current via the first and second interconnections;
    the recording layer being provided between the first layer and the second layer and being capable of reversibly changing between a first state having a first resistance and a second state having a second resistance higher than the first resistance by the current supplied via the first layer and the second layer,
    the recording layer including:
        a first compound layer; and
        a second compound layer,
    the first compound layer containing a first compound,
    the first compound including a first cation element and a second cation element of a type different from the first cation element, at least one of the first cation element and the second cation element being a transition element having a d-orbital partially filled with electron,
    the second compound layer containing a second compound,
    the second compound including a transition element having a d-orbital partially filled with electron, and the second compound including a void site capable of storing at least one of the first cation element and the second cation element.

2. The device according to claim 1, wherein the second compound layer is provided at least one of between the first layer and the first compound layer and between the second layer and the first compound layer.

3. The device according to claim 1, wherein the void site is provided in a plurality and at least one of the first cation element and second cation element is stored in at least part of the plurality of void sites.

4. The device according to claim 1, wherein the second compound has a resistivity not more than a resistivity of the first compound in the first state both in a case of the recording layer being in the first state and in a case of the recording layer being in the second state.

5. The device according to claim 1, wherein
the second compound includes a compound expressed by a composition formula

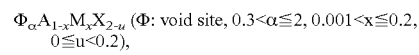

$\Phi_\alpha A_{1-x} M_x X_{2-u}$ ($\Phi$: void site, $0.3 < \alpha \leq 2$, $0.001 < x \leq 0.2$, $0 \leq u < 0.2$), A is at least one element selected from the group consisting of Ti, Zr, Hf, and Sn,
M is at least one element selected from the group consisting of V, Nb, Ta, Cr, Mo, W, As, Sb, and Bi, and
X is at least one element selected from the group consisting of O, N, and F.

6. The device according to claim 5, wherein the second compound is a compound expressed by the composition formula $\Phi_\alpha A_{1-x} M_x X_{2-u}$ and the A is Ti.

7. The device according to claim 1, wherein
the second compound includes a compound expressed by a composition formula

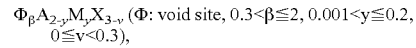

$\Phi_\beta A_{2-y} M_y X_{3-v}$ ($\Phi$: void site, $0.3 < \beta \leq 2$, $0.001 < y \leq 0.2$, $0 \leq v < 0.3$), A is at least one element selected from the group consisting of V, Nb, Ta, Cr, Mo, W, Mn, Fe, Co, Ga, and In,
M is an element different from A and is at least one element selected from the group consisting of Ti, Zr, Hf, Sn, V, Nb, Ta, As, Sb, Bi, Cr, Mo, and W, and
X is at least one element selected from the group consisting of O, N, and F.

8. The device according to claim 1, wherein
the second compound includes a compound expressed by a composition formula $$\Phi_\gamma A_{2-z} M_z X_{5-w} \ (\Phi: \text{void site}, 0.3<\gamma\leq 2, 0.001<z\leq 0.2, 0\leq w<0.5),$$

A is at least one element selected from the group consisting of V, Nb, and Ta,

M is at least one element selected from the group consisting of Cr, Mo, and W, and X is at least one element selected from the group consisting of O, N, and F.

9. The device according to claim 1, wherein the second compound has structure including at least one selected from the group consisting of corundum structure, rutile structure, ramsdellite structure, anatase structure, hollandite structure, brookite structure, and pyrolusite structure.

10. The device according to claim 9, wherein the second compound has the ramsdellite structure.

11. The device according to claim 1, wherein
the first compound includes a compound expressed by a composition formula $$A_x M_y X_4 \ (0.1\leq x\leq 2.2, 1.5\leq y\leq 2),$$

A is at lease one element selected from the group consisting of Na, K, Rb, Be, Mg, Ca, Sr, Ba, Al, Ga, Mn, Fe, Co, Ni, Cu, Zn, S, P, Se, Ge, Ag, Au, Cd, Sn, Sb, Pt, Pd, Hg, Tl, Pb, and Bi, M is an element different from A and is at least one element selected from the group consisting of Ti, Zr, Hf, V, Nb, Ta, Cr, Mo, W, Mn, Re, Fe, Co, Ni, Al, and Ga, and X is at least one of O and N.

12. The device according to claim 1, wherein
the first compound includes a compound expressed by a composition formula $$A_x M_y X_2 \ (0.1\leq x\leq 1.1, 0.9\leq y\leq 1.1),$$

A is at least one element selected from the group consisting of Li, Na, Be, Mg, Ca, Cu, Ag, Au, Pt, Pd, Rh, Hg, and Tl, M is an element different from A and is at least one element selected from the group consisting of Al, Ga, Sc, In, Y, La, Pr, Nd, Sm, Eu, Gd, Tb, Dy, Ho, Er, Tm, Tb, Lu, Ti, Ge, Sn, V, Cr, Mn, Fe, Co, Ni, Nb, Ta, Mo, W, Ru, Rh, and Pd, and X is at least one of O and N.

13. The device according to claim 1, wherein
the first compound includes a compound expressed by a composition formula $$A_x M_y X_4 \ (0.5\leq x\leq 1.1, 0.7\leq y\leq 1.1),$$

A is at least one element selected from the group consisting of Na, K, Rb, Be, Mg, Ca, Sr, Ba, Al, Ga, Ti, V, Cr, Mn, Fe, Co, Ni, Cu, Zn, Si, P, S, Se, Ge, Ag, Au, Cd, Sn, Sb, Pt, Pd, Hg, Tl, Pb, and Bi, M is an element different from A and is at least one element selected from the group consisting of V, Nb, Ta, Cr, Mn, Mo, and W, and X is at least one of O and N.

14. The device according to claim 1, wherein
the first compound includes a compound expressed by a composition formula $$A_x M_y X_3 \ (0.5\leq x\leq 1.1, 0.9\leq y\leq 1.1),$$

A is at least one element selected from the group consisting of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi, M is an element different from A and is at least one element selected from the group consisting of Al, Ga, Ti, Ge, Sn, V, Cr, Mn, Fe, Co, Ni, Nb, Ta, Mo, W, Re, Ru, and Rh, and X is at least one element of O and N.

15. The device according to claim 1, wherein one of the first layer and the second layer used as an anode contains $LaNiO_3$.

16. The device according to claim 1, wherein one of the first layer and the second layer used as a cathode contains at least one of amorphous carbon, diamond-like carbon, and $SnO_2$.

17. The device according to claim 1, wherein one of the first cation element and the second cation element moving between the first compound layer and the second compound layer has a valence of two.

18. The device according to claim 1, further comprising:
a rectifying element,
the rectifying element being provided between the first interconnection and the stacked body or between the second interconnection and the stacked body.

19. The device according to claim 18, further comprising:
a barrier layer,
the barrier layer being provided between the first interconnection and the rectifying element or between the second interconnection and the rectifying element, and the barrier layer suppressing diffusion of at least one of an element contained in the first interconnection, an element contained in the second interconnection, and an element contained in the rectifying element.

* * * * *